(12) United States Patent
Noh et al.

(10) Patent No.: US 10,804,304 B2
(45) Date of Patent: Oct. 13, 2020

(54) IMAGE SENSORS

(71) Applicant: Samsung Electronics Co., Ltd., Suwon-si, Gyeonggi-do (KR)

(72) Inventors: Hyun-pil Noh, Seongnam-si (KR); Chang-keun Lee, Seoul (KR); Je-won Yu, Yongin-si (KR); Kang-sun Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/114,453

(22) Filed: Aug. 28, 2018

(65) Prior Publication Data

US 2019/0221597 A1 Jul. 18, 2019

(30) Foreign Application Priority Data

Jan. 12, 2018 (KR) ........................ 10-2018-0004541

(51) Int. Cl.
*H01L 27/146* (2006.01)

(52) U.S. Cl.
CPC ...... *H01L 27/14623* (2013.01); *H01L 27/146* (2013.01); *H01L 27/1463* (2013.01); *H01L 27/1464* (2013.01); *H01L 27/14605* (2013.01); *H01L 27/14636* (2013.01); *H01L 27/14645* (2013.01); *H01L 27/14685* (2013.01)

(58) Field of Classification Search
CPC ........... H01L 27/14623; H01L 27/1463; H01L 27/146; H01L 27/1464; H01L 27/14685; H01L 27/14645; H01L 27/14605; H01L 27/14636
See application file for complete search history.

(56) References Cited

U.S. PATENT DOCUMENTS

| | | | |
|---|---|---|---|
| 8,138,533 B2 | 3/2012 | Koike et al. | |
| 8,247,306 B2 | 8/2012 | Nakazawa et al. | |
| 9,147,709 B2 | 9/2015 | Shimotsusa | |
| 9,653,502 B2 | 5/2017 | Yoshitsugu | |

(Continued)

FOREIGN PATENT DOCUMENTS

| | | |
|---|---|---|
| JP | 2008-153250 | 7/2008 |
| JP | 2009-278143 | 11/2009 |

OTHER PUBLICATIONS

Singaporean Search Report and Written Opinion corresponding to Singaporean Application No. 10201807792S (8 pages) (dated Jan. 24, 2019).

(Continued)

*Primary Examiner* — Marcos D. Pizarro
*Assistant Examiner* — Sue Tang
(74) *Attorney, Agent, or Firm* — Myers Bigel, P.A.

(57) ABSTRACT

Image sensors are provided. An image sensor includes a semiconductor substrate including a pixel region and an optical black region. The image sensor includes a plurality of photoelectric conversion regions in the pixel region. The image sensor includes a wiring structure on a first surface of the semiconductor substrate. The image sensor includes a light shielding layer on a second surface of the semiconductor substrate in the optical black region. Moreover, the image sensor includes a light shielding wall structure that is in the semiconductor substrate between the pixel region and the optical black region and that is connected to the light shielding layer.

20 Claims, 21 Drawing Sheets

(56) References Cited

U.S. PATENT DOCUMENTS

| | | |
|---|---|---|
| 9,666,616 B2 | 5/2017 | Lee et al. |
| 9,780,142 B1 | 10/2017 | Koo et al. |
| 10,165,211 B1* | 12/2018 | Borthakur ............ H04N 5/3696 |
| 2009/0065885 A1* | 3/2009 | Hwang ............. H01L 27/14623 257/435 |
| 2010/0201834 A1* | 8/2010 | Maruyama .............. H01L 31/18 348/222.1 |
| 2012/0313208 A1* | 12/2012 | Kim ...................... H01L 23/481 257/435 |
| 2013/0001728 A1 | 1/2013 | De Amicis |
| 2013/0099341 A1 | 4/2013 | Shim et al. |
| 2013/0113968 A1 | 5/2013 | Lenchenkov et al. |
| 2013/0200396 A1 | 8/2013 | Zheng et al. |
| 2013/0207212 A1 | 8/2013 | Mao et al. |
| 2013/0323875 A1 | 12/2013 | Park et al. |
| 2014/0263962 A1* | 9/2014 | Ahn .................. H01L 27/14685 250/208.1 |
| 2016/0049430 A1 | 2/2016 | Nomura |
| 2016/0111463 A1* | 4/2016 | Borthakur ........... H01L 27/1462 348/294 |
| 2016/0204144 A1 | 7/2016 | Lee |
| 2016/0233258 A1* | 8/2016 | Crocherie ......... H01L 27/14636 |
| 2017/0025461 A1 | 1/2017 | Lee et al. |
| 2017/0244920 A1 | 8/2017 | Ohkubo et al. |
| 2018/0006071 A1 | 1/2018 | Kato et al. |

OTHER PUBLICATIONS

Partial European Search Report corresponding to European Application No. 19150278.0 (12 pages) (dated Jun. 4, 2019).

\* cited by examiner

IMAGE SENSORS

CROSS-REFERENCE TO RELATED APPLICATION

This application claims priority under 35 U.S.C. § 119 to Korean Patent Application No. 10-2018-0004541, filed on Jan. 12, 2018, in the Korean Intellectual Property Office, the disclosure of which is hereby incorporated herein by reference in its entirety.

BACKGROUND

The present disclosure relates to image sensors. An image sensor is a device for converting an optical image into an electrical signal. The image sensor may include a pixel region including a plurality of photodiodes receiving light and converting the light into an electrical signal. Moreover, the image sensor may include an optical black region including a reference pixel for removing a noise signal caused by a dark current.

As an integration density of the image sensor increases, a size of each of the plurality of photodiodes, and an area of the optical black region, may decrease. If undesired light penetrates into the optical black region, however, then signal distortion may occur as a result of dark current generated in the optical black region.

SUMMARY

According to example embodiments of the inventive concepts, an image sensor may include a semiconductor substrate including a pixel region and an optical black region. The image sensor may include a plurality of photoelectric conversion regions in the pixel region. The image sensor may include a wiring structure on a first surface of the semiconductor substrate. The image sensor may include a light shielding layer on a second surface of the semiconductor substrate in the optical black region. Moreover, the image sensor may include a first light shielding wall structure penetrating the semiconductor substrate between the pixel region and the optical black region. The first light shielding wall structure may be connected to the light shielding layer.

According to example embodiments of the inventive concepts, an image sensor may include a semiconductor substrate including a pixel region, an optical black region, and a dummy pixel region between the pixel region and the optical black region. The image sensor may include a plurality of photoelectric conversion regions in the pixel region. The image sensor may include a wiring structure on a first surface of the semiconductor substrate. The image sensor may include a light shielding layer on a second surface of the semiconductor substrate in the optical black region. Moreover, the image sensor may include at least one first light shielding wall structure in the dummy pixel region. The at least one first light shielding wall structure may penetrate the semiconductor substrate and be connected to the light shielding layer.

According to example embodiments of the inventive concepts, an image sensor may include a semiconductor substrate including a pixel region, an optical black region, and a dummy pixel region between the pixel region and the optical black region. The image sensor may include a plurality of photoelectric conversion regions in the pixel region. The image sensor may include a wiring structure on a first surface of the semiconductor substrate. The image sensor may include a light shielding layer on a second surface of the semiconductor substrate in at least a portion of each of the optical black region and the dummy pixel region. Moreover, the image sensor may include a light shielding wall structure in the semiconductor substrate in the dummy pixel region. The light shielding layer may vertically overlap the light shielding wall structure.

DETAILED DESCRIPTION

Figure 1:
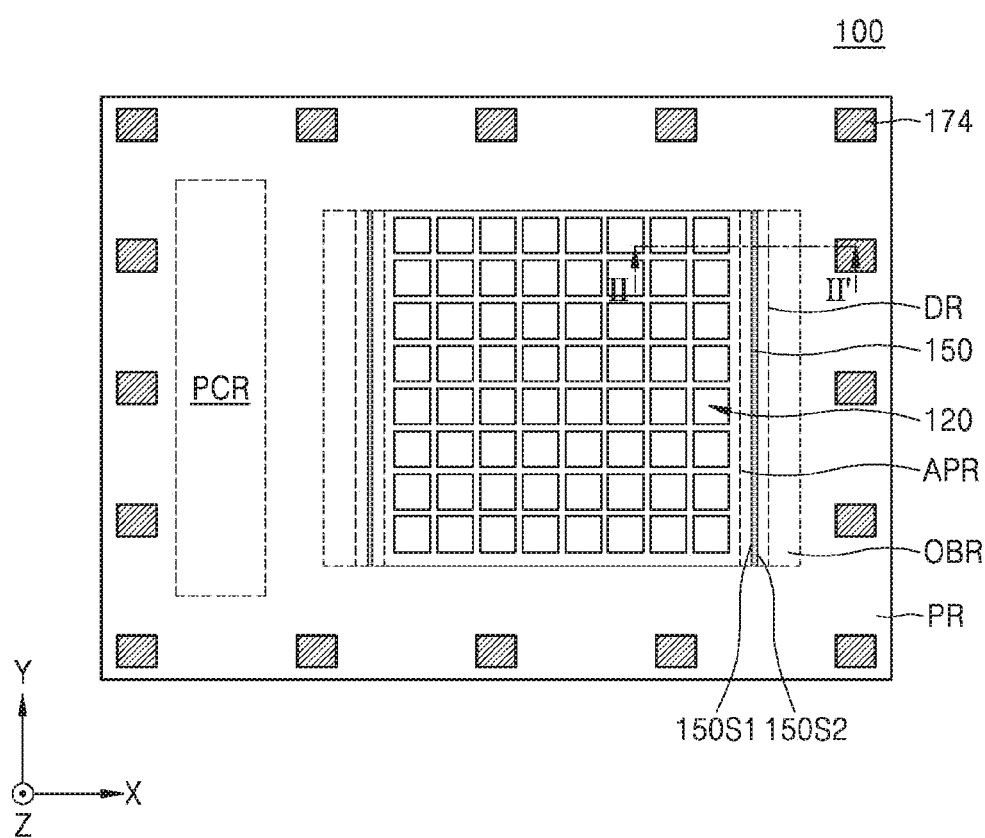
FIG. 1 is a layout diagram of an image sensor according to example embodiments.

Various example embodiments will now be described more fully hereinafter with reference to the accompanying drawings. Like reference numerals may refer to like elements throughout this application.

Figure 2:
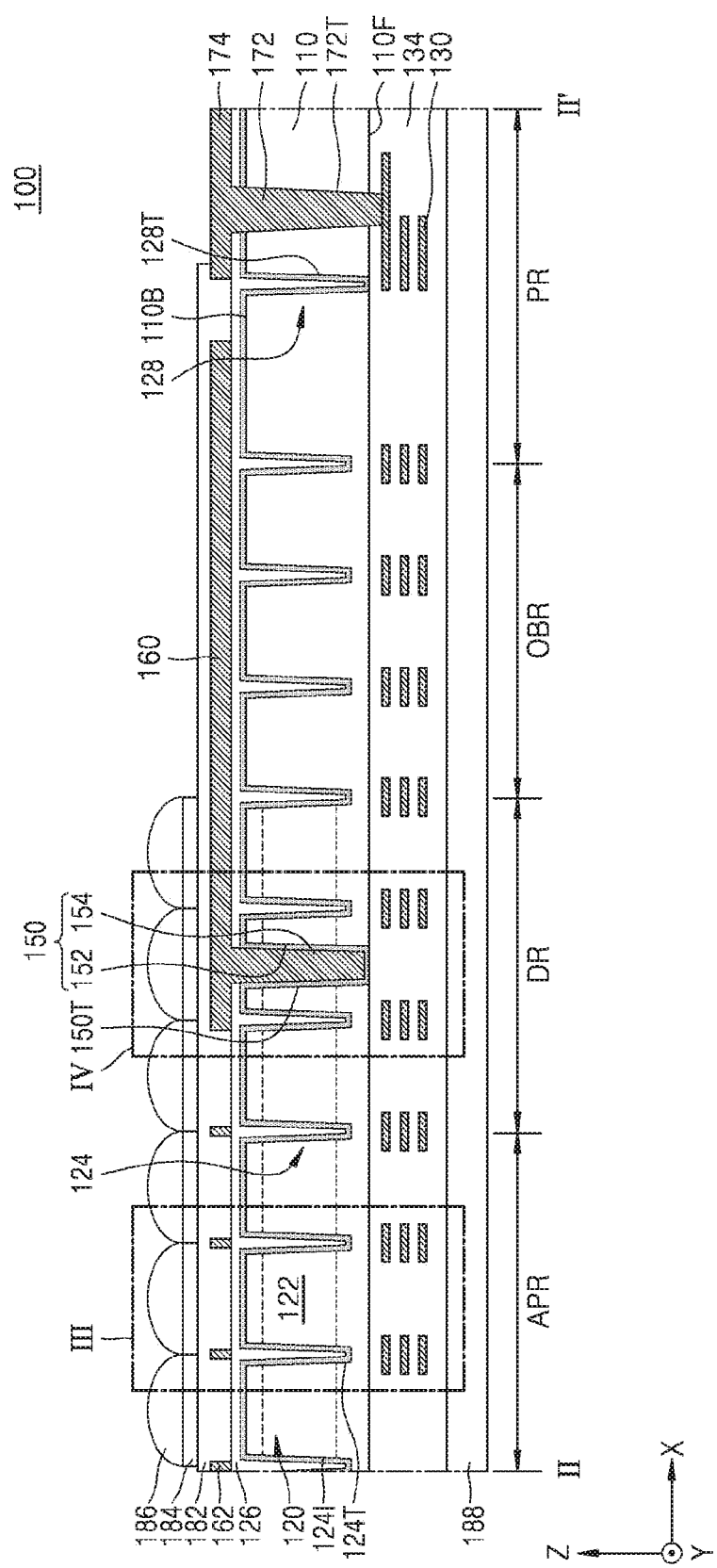
FIG. 2 is a cross-sectional view taken along line II-II' of FIG. 1, illustrating an image sensor according to example embodiments.
Figure 3:
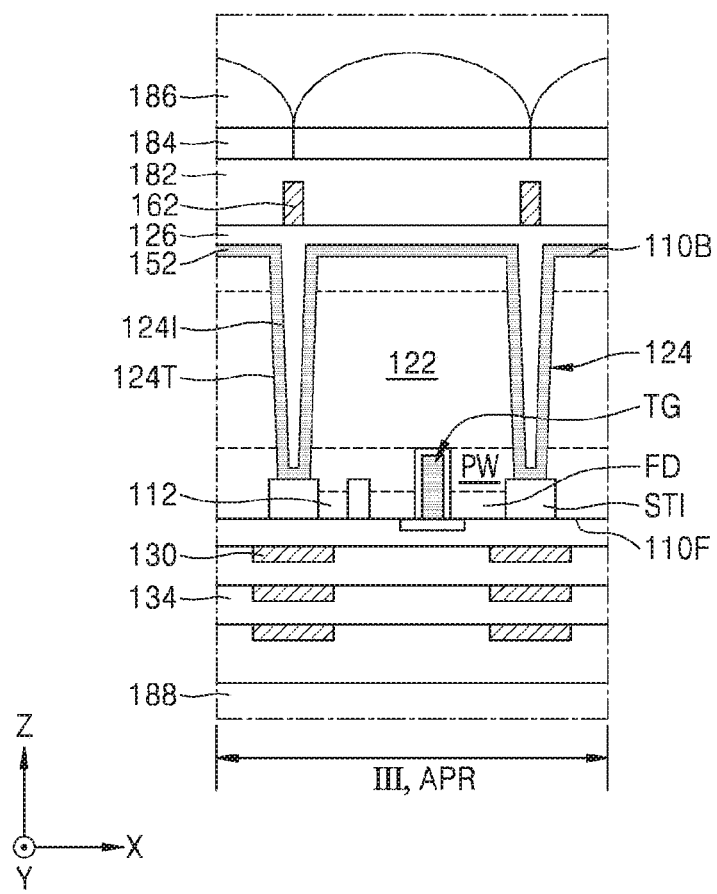
FIG. 3 is an enlarged view of portion III of FIG. 2.
Figure 4:
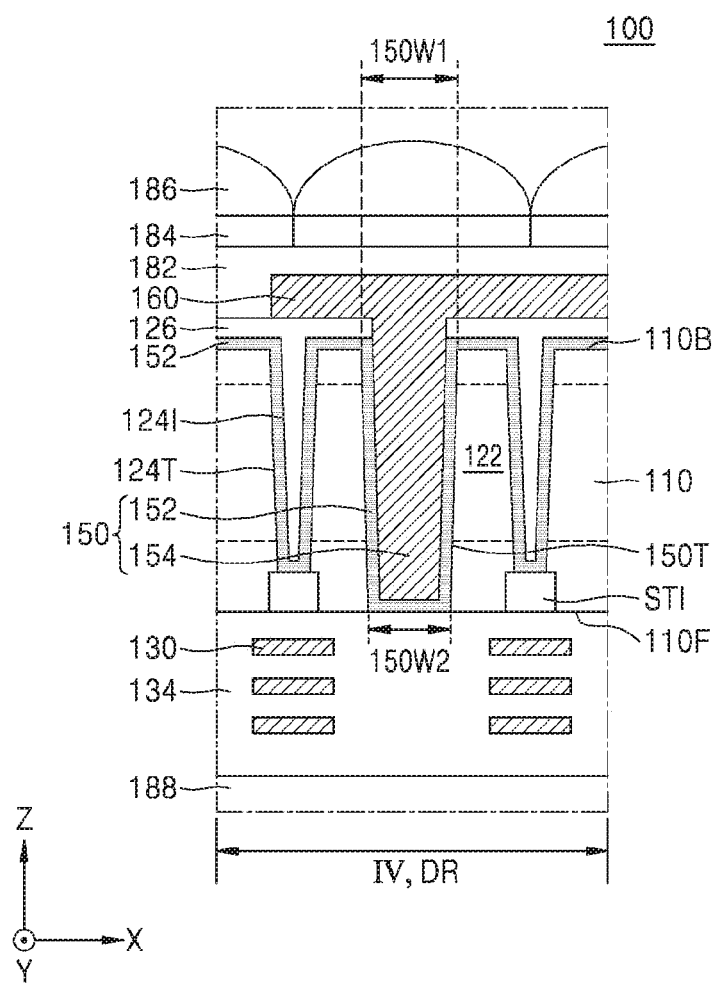
FIG. 4 is an enlarged view of portion IV of FIG. 2.

FIG. 1 is a layout diagram of an image sensor according to example embodiments. FIG. 2 is a cross-sectional view taken along line II-II' of FIG. 1, illustrating an image sensor according to example embodiments. FIG. 3 is an enlarged view of portion III of FIG. 2. FIG. 4 is an enlarged view of portion IV of FIG. 2. In FIG. 1, a configuration element, e.g., a light shielding layer, of the image sensor is omitted for the brevity of illustration.

Referring to FIGS. 1 to 4, an image sensor 100 includes a pixel region APR, a dummy pixel region DR, an optical black region OBR, and a peripheral region PR.

The pixel region APR includes a plurality of photoelectric conversion regions 120. The optical black region OBR is disposed on at least one side of the pixel region APR. The dummy pixel region DR is disposed between the pixel region APR and the optical black region OBR. The peripheral region PR surrounds the pixel region APR and the optical region OBR. The optical black region OBR and the peripheral region PR may not include (i.e., may be free of) the plurality of photoelectric conversion regions 120.

The pixel region APR may be arranged in any shape or configuration. For example, as shown in FIG. 1, in the pixel region APR, the plurality of photoelectric conversion regions 120 may be arranged in a matrix/array having rows and columns along a first direction (e.g., an X direction) parallel to an upper surface of a semiconductor substrate 110 and a second direction (e.g., a Y direction) parallel to the upper surface of the semiconductor substrate 110 and crossing the first direction (X direction). In the dummy pixel region DR, a first light shielding wall structure 150 extends in the second direction (Y direction). In plan view (e.g., as illustrated in FIG. 1), the first light shielding wall structure 150 may extend in the second direction (Y direction) between the optical black region OBR and the pixel region APR by a length (i.e., the entire length) of the optical black region OBR in the second direction (Y direction).

A peripheral circuit region PCR and a conductive pad 174 are disposed in the peripheral region PR. The peripheral circuit region PCR may be disposed on one side of the pixel region APR, in plan view, but is not limited thereto. In some embodiments, the peripheral circuit region PCR may surround the pixel region APR and the optical black region OBR. The conductive pad 174 may be disposed in an edge region of the peripheral region PR. The peripheral region PR may be beside (e.g., on a side of) the optical black region OBR.

The semiconductor substrate 110 has a first surface 110F and a second surface 110B that are opposite to each other. Herein, a surface of the semiconductor substrate 110 on which a color filter 184 is disposed refers to the second surface 110B, and another surface of the semiconductor substrate 110 that is opposite to the second surface 110B refers to the first surface 110F. However, the inventive concepts are not limited thereto. The semiconductor substrate 110 may include a p-type semiconductor substrate. For example, the semiconductor substrate 110 may include a p-type silicon substrate. In some embodiments, the semiconductor substrate 110 may include a p-type bulk substrate and a p- or n- type epitaxial layer thereon. In some embodiments, the semiconductor substrate 110 may include an n-type bulk substrate and a p- or n- type epitaxial layer thereon. In some embodiments, the semiconductor substrate 110 may include an organic plastic substrate.

The plurality of photoelectric conversion regions 120 is disposed in the semiconductor substrate 110 in the pixel region APR. Each of the plurality of photoelectric conversion regions 120 includes a photodiode region 122 and a well region PW (FIG. 3).

A device isolation region 124 is disposed between each of the plurality of photoelectric conversion regions 120. The device isolation region 124 may be disposed between each of the plurality of photoelectric conversion regions 120 arranged in a matrix/array form and have a grid or mesh shape in plan view. The device isolation region 124 may be disposed in a device isolation trench 124T in (e.g., partly penetrating) the semiconductor substrate 110. In some embodiments, a plurality of device isolation regions 124 may be respectively disposed between the plurality of photoelectric conversion regions 120 arranged in a matrix/array form and be arranged in a grid or mesh shape in plan view. For example, each device isolation region 124 may be between a respective pair of the photoelectric conversion regions 120.

In some embodiments, the device isolation region 124 includes a backside insulation layer 124I that conformally extends along an inner surface of the device isolation trench 124T and a buried insulation layer 126 that is disposed on the backside insulation layer 124I and is in (e.g., partially or completely fills) the device isolation trench 124T. The backside insulation layer 124I may include metal oxide (e.g., hafnium oxide, aluminum oxide, or tantalum oxide). The backside insulation layer 124I may act as a negative fixed charge layer, but is not limited thereto. In some embodiments, the backside insulation layer 124I may include an insulating material (e.g., silicon oxide, silicon nitride, or silicon oxynitride). The buried insulation layer 126 may include an insulating material (e.g., silicon oxide, silicon nitride, or silicon oxynitride).

Referring to FIG. 2, the backside insulation layer 124I and the buried insulation layer 126 may extend from the inside of the device isolation trench 124T to the second surface 110B of the semiconductor substrate 110. For example, the backside insulation layer 124I may conformally extend along the inner surface of the device isolation trench 124T and along the second surface 110B of the semiconductor substrate 110, and the buried insulation layer 126 may be disposed on the backside insulation layer 124I and cover the entirety of the second surface 110B of the semiconductor substrate 110.

In some embodiments, the backside insulation layer 124I may be formed with a sufficient thickness to fill the device isolation trench 124T. In this case, the buried insulation layer 126 may not be formed in the device isolation trench 124T but cover the backside insulation layer 124I on the second surface 110B of the semiconductor substrate 110.

A wiring structure, such as a first inner wiring structure 130, is disposed on the first surface 110F of the semiconductor substrate 110. The first inner wiring structure 130 may be formed of a stack of a plurality of conductive layers. The first inner wiring structure 130 may include, for example, polysilicon, metal, metal silicide, metal nitride, and/or a metal-containing layer. For example, the first inner wiring structure 130 may include tungsten, aluminum, copper, tungsten silicide, titanium silicide, tungsten nitride, titanium nitride, or doped polysilicon.

A first interlayer insulation layer 134 is disposed on the first surface 110F of the semiconductor substrate 110 to cover the first inner wiring structure 130. The first interlayer insulation layer 134 may include an insulating material (e.g., silicon oxide, silicon nitride, or silicon oxynitride).

Referring to FIG. 3, a device isolation layer STI that defines an active region 112 and a floating diffusion region FD is formed in/on the first surface 110F of the semiconductor substrate 110. Gate electrodes constituting a plurality of transistors may be formed on the first surface 110F of the semiconductor substrate 110. The first inner wiring structure 130 may be electrically connected to the gate electrodes and/or the active region 112. The gate electrodes may be covered by the first interlayer insulation layer 134.

For example, the plurality of transistors may include a transfer transistor TG, which transfers charges generated by each photoelectric conversion region 120 to a floating diffusion region FD, a reset transistor which periodically resets the charges stored in the floating diffusion region FD, a drive transistor which serves as a source follower buffer amplifier and buffers signals based on the charges stored in the floating diffusion region FD, and a selection transistor which performs switching and addressing to select the pixel region APR. However, the plurality of transistors are not limited thereto.

A guide pattern 162 is disposed on the buried insulation layer 126 in the pixel region APR. The guide pattern 162 may have a mesh or grid shape. The guide pattern 162 may inhibit/prevent light that is obliquely incident into one of the plurality of photoelectric conversion regions 120 from penetrating into another one of the plurality of photoelectric conversion regions 120 adjacent thereto. The guide pattern 162 may include metal (e.g., tungsten, aluminum, titanium, ruthenium, cobalt, nickel, copper, gold, silver, or platinum).

A passivation layer 182 is disposed on the second surface 110B of the semiconductor substrate 110 to overlap/cover the buried insulation layer 126 and the guide pattern 162. A color filter 184 and a micro-lens 186 are disposed on the passivation layer 182. A supporting substrate 188 is selectively disposed on the first surface 110F of the semiconductor substrate 110.

The optical black region OBR is disposed on a side of the pixel region APR. The optical black region OBR may have a structure similar to that of the pixel region APR. For example, the device isolation region 124 partly penetrating the semiconductor substrate 110 may be disposed in the optical black region OBR. In the optical black region OBR, the device isolation region 124 may include the device isolation trench 124T partly penetrating the semiconductor substrate 110, the backside insulation layer 124I on the inner surface of the device isolation trench 124T, and the buried insulation layer 126 filling the device isolation trench 124T. As shown in FIG. 2, the photodiode region 122, which is in the photoelectric conversion region 120 in the pixel region APR, may be omitted from the optical black region OBR, but the inventive concepts are not limited thereto. For example, the photodiode region 122 may, in some embodiments, be formed in the semiconductor substrate 110 in the optical black region OBR.

A light shielding layer 160 is disposed on the second surface 110B of the semiconductor substrate 110 in the optical black region OBR. The light shielding layer 160 may include metal (e.g., tungsten, aluminum, titanium, ruthenium, cobalt, nickel, copper, gold, silver, or platinum). The light shielding layer 160 may be disposed on the buried insulation layer 126 and overlap/cover the entirety of the optical black region OBR. The passivation layer 182 is disposed on the light shielding layer 160.

The optical black region OBR may act as a reference pixel with respect to the pixel region APR and act to automatically compensate a dark current signal. For example, the light shielding layer 160 may block incidence of light into the reference pixel in the optical black region OBR. By measuring a reference charge quantity generated in the reference pixel shielded from light and comparing the quantity of reference charge to a sensed charge quantity generated from the pixel region APR, a light signal input from the pixel region APR may be calculated from a difference between the sensed charge quantity and the reference charge quantity.

The dummy pixel region DR is disposed between the optical black region OBR and the pixel region APR. The dummy pixel region DR may be configured to inhibit/prevent a patterning failure from occurring during a process of forming the color filter 184 on the pixel region DR, and also inhibit/prevent the light from penetrating into the optical black region OBR.

The first light shielding wall structure 150 is disposed in the dummy pixel region DR. The first light shielding wall structure 150 may completely penetrate the semiconductor substrate 110. For example, the first light shielding wall structure 150 may continuously extend from the second surface 110B of the semiconductor substrate 110 to the first surface 110F of the semiconductor substrate 110. The light shielding layer 160 may extend from the optical black region OBR to the dummy pixel region DR to be connected to the first light shielding wall structure 150.

The first light shielding wall structure 150 includes a light shielding insulation layer 152 on an inner surface of a first light shielding trench 150T that penetrates the semiconductor substrate 110 and a light shielding metal layer 154 on the light shielding insulation layer 152 to partially or completely fill the first light shielding trench 150T. Moreover, the first light shielding wall structure 150 is physically spaced apart, and electrically isolated, from the first inner wiring structure 130.

Referring to FIG. 4, the first light shielding trench 150T is in (e.g., partially or completely penetrates) the semiconductor substrate 110 and extends in the second direction (Y direction). The first light shielding trench 150T may have a first width 150W1 in the first direction (X direction) at the same level as (i.e., at a level coplanar with) the second surface 110B of the semiconductor substrate 110 and a second width 150W2 in the first direction (X direction) at the same level as (i.e., at a level coplanar with) the first surface 110F of the semiconductor substrate 110. The first width 150W1 may be greater than the second width 150W2. For example, the first light shielding wall structure 150 may have the first width 150W1 in the first direction (X direction) at the same level as the second surface 110B of the semiconductor substrate 110 and the second width 150W2, that is less than the first width 150W1, in the first direction (X direction) at the same level as the first surface 110F of the semiconductor substrate 110. Accordingly, the width of the first light shielding wall structure 150 may be tapered toward the first surface 110F of the semiconductor substrate 110.

The light shielding insulation layer 152 may conformally extend along the inner surface of the first light shielding trench 150T and contact the first interlayer insulation layer 134 on a lower surface of the first light shielding trench 150T. The light shielding insulation layer 152 may extend onto the second surface 110B of the semiconductor substrate 110 to be connected to the backside insulation layer 124I, such that the light shielding insulation layer 152 is integrally coupled/connected to the backside insulation layer 124I.

In some embodiments, the light shielding insulation layer 152 may include metal oxide (e.g., hafnium oxide, aluminum oxide, or tantalum oxide). In some embodiments, the light shielding insulation layer 152 may include an insulating material (e.g., silicon oxide, silicon nitride, or silicon oxynitride). In some embodiments, the light shielding insulation layer 152 may include the same material as the backside insulation layer 124I. The light shielding insulation layer 152 may be formed by the same process as forming the backside insulation layer 124I. However, the inventive concepts are not limited thereto. For example, the light shielding insulation layer 152 and the backside insulation layer 124I may be formed of different materials.

The light shielding metal layer 154 may partially or completely fill the first light shielding trench 150T and contact the light shielding layer 160. The light shielding metal layer 154 may include metal (e.g., tungsten, aluminum, titanium, ruthenium, cobalt, nickel, copper, gold, silver, or platinum). In some embodiments, the light shielding metal layer 154 may include the same material (e.g., the same metal) as the light shielding layer 160 and be formed by the same process as forming the light shielding layer 160. For example, the light shielding metal layer 154 and the light shielding layer 160 may be formed of a continuous material layer, and/or be integrally coupled/connected to each other. In some embodiments, the light shielding metal layer 154 may include a different material from the light shielding layer 160.

Referring to FIG. 1, the optical black region OBR is arranged on opposite sides of the pixel region APR. The first light shielding wall structure 150 extends in the second direction (Y direction) between the optical black region OBR and pixel region APR by a length (i.e., the entire length) of the dummy pixel region DR in the second direction (Y direction). In addition, referring to FIG. 1, the first light shielding wall structure 150 may have a first side 150S1 facing the pixel region APR and a second side 150S2 facing the optical black region OBR, that extend in a longitudinal direction (i.e., the second direction (Y direction)).

The first light shielding wall structure 150 may continuously extend from the second surface 110B of the semiconductor substrate 110 to the first surface 110F of the semiconductor substrate 110 and include the same metal material as the light shielding layer 160. Thus, undesired stray light may be inhibited/prevented from penetrating from the pixel region APR into the optical black region OBR. For example, the long wavelength light that is obliquely incident into the pixel region APR may be blocked by the first side 150S1 of the first light shielding wall structure 150, thus inhibiting/preventing the undesired light penetration or leakage into the optical black region OBR. In addition, electrons generated by the light received in the pixel region APR may be blocked by the first side 150S1 of the first light shielding wall structure 150, such that a dark current signal may be inhibited/prevented from entering in the optical black region OBR.

The color filter 184 and the micro-lens 186 are disposed on the passivation layer 182 in the dummy pixel region DR adjacent to the pixel region APR. Thus, a patterning failure of the color filter 184 in the pixel region APR caused by a difference in a thickness of the passivation layer 182 in the pixel region APR and the optical black region OBR may be inhibited/prevented.

A through via trench 172T is disposed in the peripheral region PR and penetrates the semiconductor substrate 110. A through via 172 is disposed in the through via trench 172T to be electrically connected to the first inner wiring structure 130. The through via 172 may provide a conductive pathway through the semiconductor substrate 110 from the second surface 110B of the semiconductor substrate 110 to the first surface 110F of the semiconductor substrate 110. A conductive pad 174 is disposed on the through via 172. A pad isolation region 128 penetrates the semiconductor substrate 110 and surrounds the through via 172 and the conductive pad 174. The pad isolation region 128 includes the backside insulation layer 124I on an inner surface of a pad isolation trench 128T which penetrates the semiconductor substrate 110, and includes the buried insulation layer 126 on the backside insulation layer 124I to partially or completely fill the pad isolation trench 128T. The through via 172 and/or the conductive pad 174 may be electrically insulated from a portion of the semiconductor substrate 110 in the optical black region OBR or the pixel region APR by the pad isolation region 128.

Referring to FIG. 2, the conductive pad 174 is disposed on the through via 172. The conductive pad 174 and the through via 172 may vertically overlap each other in a third direction (e.g., a Z direction) perpendicular to the second surface 110B of the semiconductor substrate 110, but are not limited thereto. For example, the through via 172 and the conductive pad 174 may, in some embodiments, be disposed not to vertically overlap each other, but a conductive layer may be further provided on the second surface 110B of the semiconductor substrate 110 to electrically connect the through via 172 and the conductive pad 174. In addition, an outer connection terminal may be disposed on the conductive pad 174, and an image signal, a control signal, and/or a power voltage may be provided or transmitted to the first inner wiring structure 130 through the outer connection terminal.

In the image sensor 100 according to example embodiments, as the first light shielding wall structure 150 continuously extends from the second surface 110B of the semiconductor substrate 110 to the first surface 110F of the semiconductor substrate 110 in the dummy pixel region DR, the optical black region OBR may be protected from penetration of undesired stray light or electrons. Thus, a dark current signal may be inhibited/prevented from entering in the optical black region OBR such that a noise signal variation of the image sensor 100 may be reduced.

Figure 5:
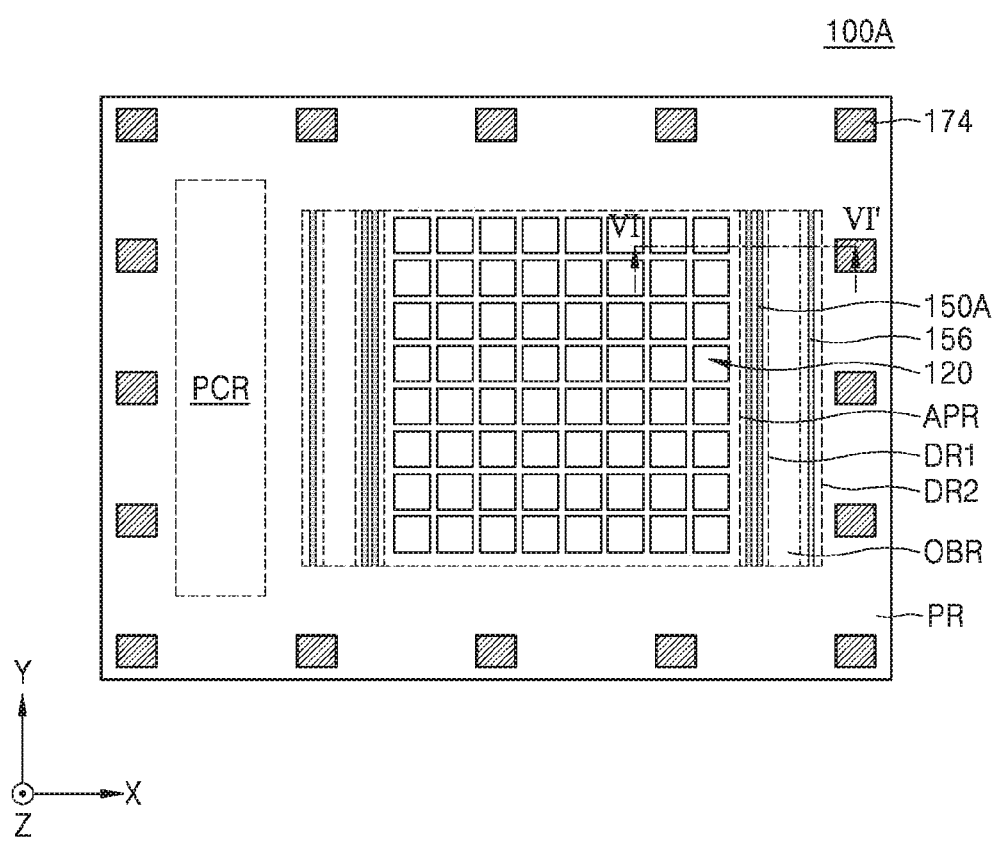
FIG. 5 is a layout diagram of an image sensor according to example embodiments.
Figure 6:
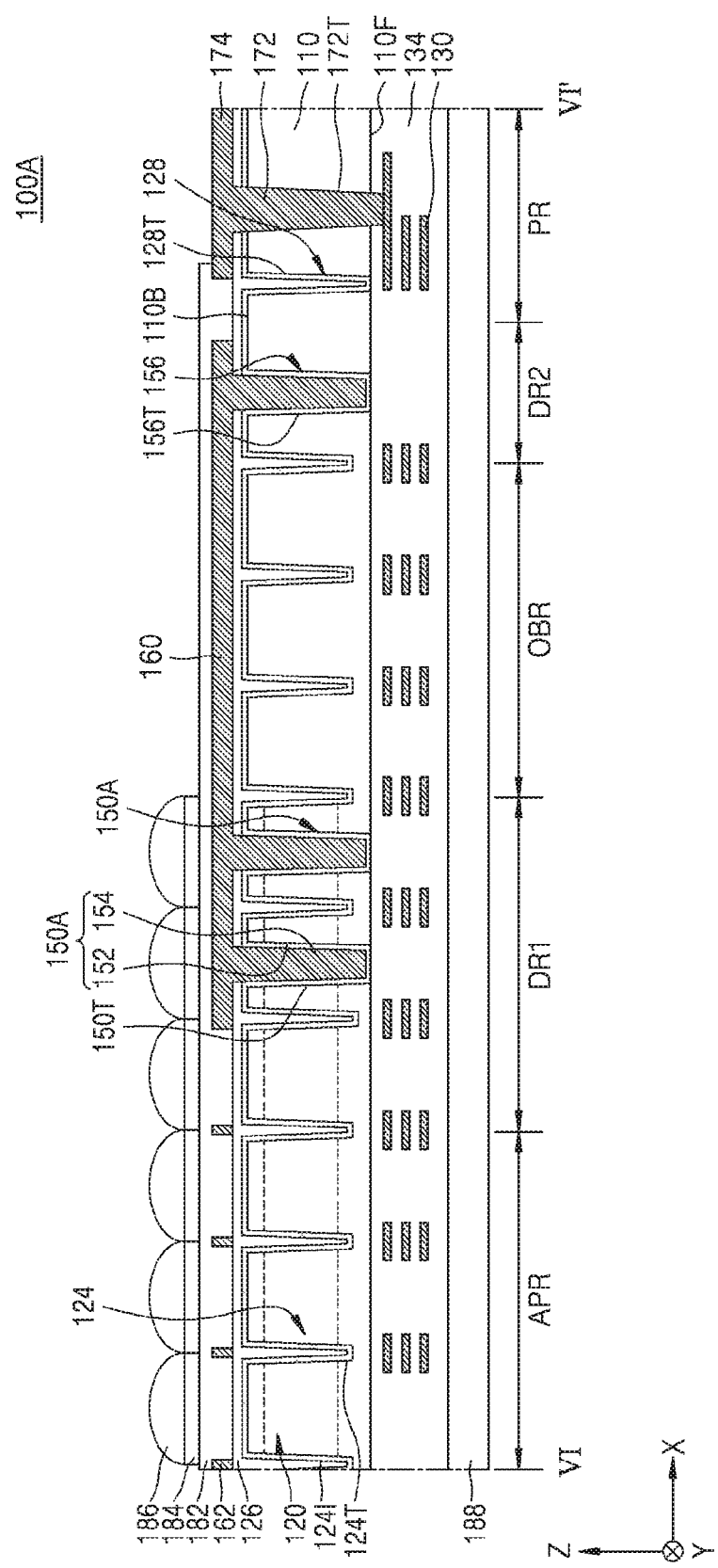
FIG. 6 is a cross-sectional view taken along line VI-VI' of FIG. 5.

FIG. 5 is a layout diagram of an image sensor according to example embodiments. FIG. 6 is a cross-sectional view taken along line VI-VI' of FIG. 5. In FIGS. 5 and 6, the same reference numerals are used to denote the same elements as in FIGS. 1 to 4.

Referring to FIGS. 5 and 6, in an image sensor 100A, a pair of first light shielding wall structures 150A are disposed in a dummy pixel region DR1 between the optical black region OBR and the pixel region APR. The pair of first light shielding wall structures 150A may be spaced a predetermined distance apart from each other and extend in the second direction (Y direction) by a length (i.e., the entire length) of the dummy pixel region DR1 in the second direction (Y direction). The light shielding layer 160 may be disposed to vertically overlap the pair of first light shielding wall structures 150A in the dummy pixel region DR1.

In some embodiments, the semiconductor substrate 110 further includes a guard ring region DR2 between the peripheral region PR and the optical black region OBR. The guard ring region DR2 may be adjacent to the optical black region OBR and extend in the second direction (Y direction). A second light shielding wall structure 156 may extend in the second direction (Y direction) in the guard ring region DR2. The second light shielding wall structure 156 may be formed of a structure similar to that of any of the pair of first light shielding wall structures 150A. For example, the second light shielding wall structure 156 includes the light shielding insulation layer 152 on an inner surface of a second light shielding trench 156T which penetrates the semiconductor substrate 110, and includes the light shielding metal layer 154 disposed on the light shielding insulation layer 152 to partially or completely fill the second light shielding trench 156T.

The second light shielding wall structure 156 may be disposed between the optical black region OBR and the conductive pad 174 or between the optical black region OBR and the peripheral circuit region PCR. The second light shielding wall structure 156 may inhibit/prevent light or electrons generated in a certain circuit in the peripheral circuit region PCR from penetrating into the optical black region OBR.

In the image sensor 100A according to example embodiments, as the pair of first light shielding wall structures 150A are disposed between the optical black region OBR and the pixel region APR, undesired stray light or electrons may be inhibited/prevented from penetrating from the pixel region APR into the optical black region OBR by the pair of first light shielding wall structures 150A. Light that is obliquely incident into the optical black region OBR may be blocked by the pair of first light shielding wall structures 150A. In addition, light that is irradiated into the first interlayer insulation layer 134 and then is reflected or scattered from the first inner wiring structure 130 in the first interlayer insulation layer 134, may be inhibited/prevented from being incident into the optical black region OBR by the pair of first light shielding wall structures 150A. The second light shielding wall structure 156 may inhibit/prevent light or electrons generated in a certain circuit in the peripheral circuit region PCR from penetrating into the optical black region OBR. Thus, a noise signal variation of the image sensor 100A may be reduced.

Figure 7:
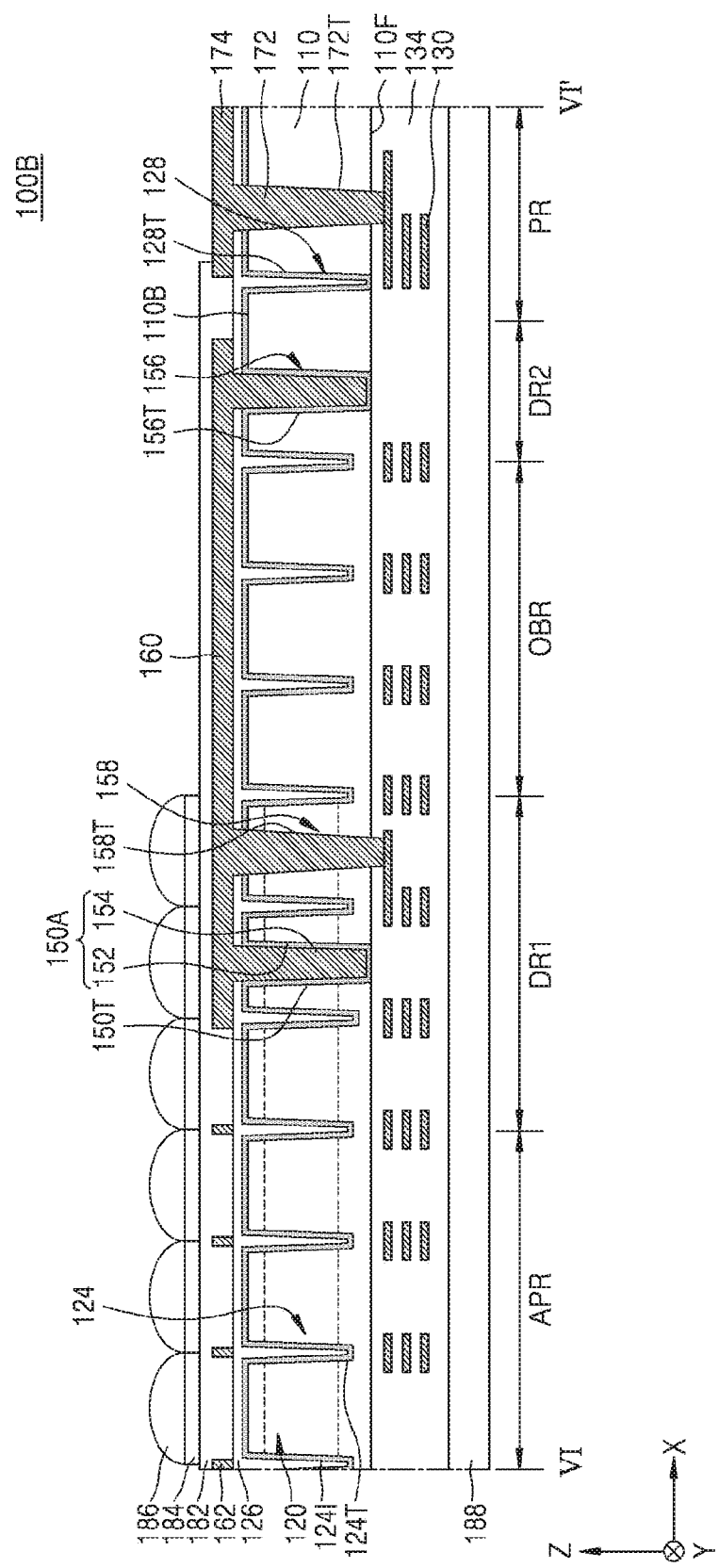
FIG. 7 is a cross-sectional view of an image sensor according to example embodiments.

FIG. 7 is a cross-sectional view of an image sensor according to example embodiments. FIG. 7 is a cross-sectional view taken along line VI-VI' of FIG. 5. In FIG. 7, the same reference numerals are used to denote the same elements as in FIGS. 1 to 6.

Referring to FIG. 7, in an image sensor 100B, a third light shielding wall structure 158 is disposed spaced apart from the first light shielding wall structure 150A in the dummy pixel region DR1. The third light shielding wall structure 158 includes the light shielding metal layer 154 in a third light shielding trench 158T penetrating the semiconductor substrate 110. The backside insulation layer 124I (and the light shielding insulation layer 152) may not be disposed in the third light shielding trench 158T, such that the light shielding metal layer 154 may directly contact the semiconductor substrate 110 in the third light shielding trench 158T.

The third light shielding wall structure 158 may penetrate the semiconductor substrate 110 and extend into the first interlayer insulation layer 134 on the first surface 110F of the semiconductor substrate 110. For example, a bottom portion of the third light shielding wall structure 158 may be surrounded by the first interlayer insulation layer 134. A lower surface of the third light shielding wall structure 158 may be substantially at the same level as (e.g., at a level coplanar with) a lower surface of the through via 172. In some embodiments, the third light shielding wall structure 158 may be connected to the first inner wiring structure 130. In some embodiments, the first interlayer insulation layer 134 may physically and electrically separate the third light shielding wall structure 158 from the first inner wiring structure 130.

In some embodiments, the third light shielding trench 158T may be formed by the same process as forming the through via trench 172T. An upper portion of the third light shielding trench 158T may penetrate the backside insulation layer 124I and the buried insulation layer 126. A sidewall of an upper portion of the third light shielding wall structure 158 may be surrounded by the backside insulation layer 124I and the buried insulation layer 126.

In the image sensor 100B according to example embodiments, as the first light shielding wall structure 150A and the third light shielding wall structure 158 are disposed between the optical black region OBR and the pixel region APR, undesired stray light or electrons may be inhibited/prevented from penetrating from the pixel region APR into the optical black region OBR by the first light shielding wall structure 150A and the third light shielding wall structure 158. Light that is obliquely incident into the optical black region OBR may be blocked by the first light shielding wall structure 150A and the third light shielding wall structure 158. In addition, light that is irradiated into the first interlayer insulation layer 134 and then is reflected or scattered from the first inner wiring structure 130 in the first interlayer insulation layer 134, may be inhibited/prevented from being incident into the optical black region OBR by the first light shielding wall structure 150A and the third light shielding wall structure 158. Thus, a noise signal variation of the image sensor 100B may be reduced.

Figure 8:
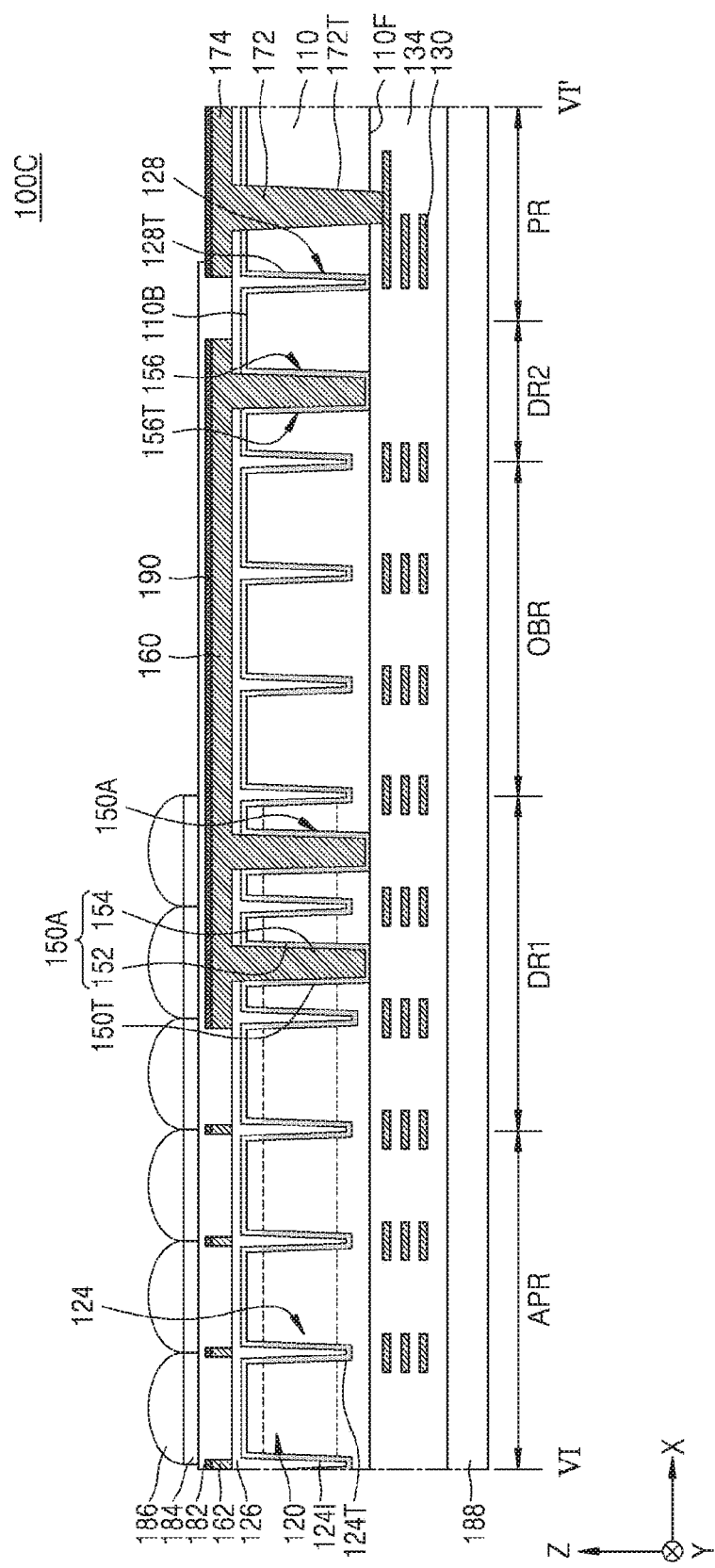
FIG. 8 is a cross-sectional view of an image sensor according to example embodiments

FIG. 8 is a cross-sectional view of an image sensor according to example embodiments. FIG. 8 is a cross-sectional view taken along line VI-VI' of FIG. 5. In FIG. 8, the same reference numerals are used to denote the same elements as in FIGS. 1 to 7.

Referring to FIG. 8, in an image sensor 100C, a reflection blocking/prevention metal layer 190 is further disposed on the light shielding layer 160, the guide pattern 162, and the conductive pad 174. The reflection blocking/prevention metal layer 190 may include metal (e.g., titanium nitride, tantalum nitride, titanium, or tantalum).

In some embodiments, after the first light shielding trench 150T, the second light shielding trench 156T, and the through via trench 172T are formed, a metal layer is formed on the second surface 110B of the semiconductor substrate 110 in (e.g., to fill) the first light shielding trench 150T, the second light shielding trench 156T, and the through via trench 172T. In some embodiments, a reflection blocking/prevention preliminary metal layer is formed on the metal layer, and then the reflection blocking/prevention preliminary layer and the metal layer are simultaneously or sequentially patterned to form the light shielding layer 160, the guide pattern 162, the conductive pad 174, and the reflection blocking/prevention metal layer 190.

Figure 9:
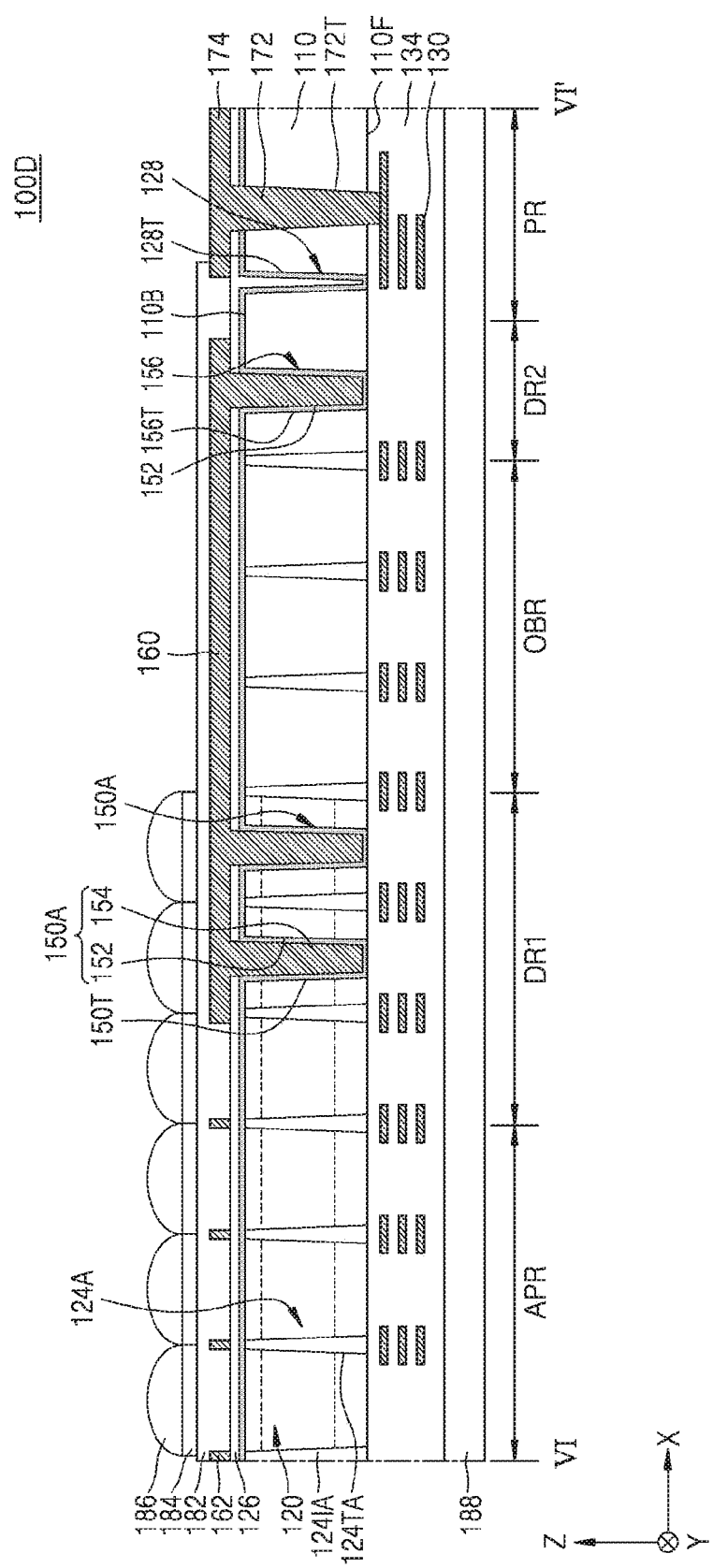
FIG. 9 is a cross-sectional view of an image sensor according to example embodiments.

FIG. 9 is a cross-sectional view of an image sensor according to example embodiments. FIG. 9 is a cross-sectional view taken along line VI-VI' of FIG. 5. In FIG. 9, the same reference numerals are used to denote the same elements as in FIGS. 1 to 8.

Referring to FIG. 9, in an image sensor 100D, a device isolation region 124A is disposed to penetrate the semiconductor substrate 110 from the first surface 110F of the semiconductor substrate 110 to the second surface 110B of the semiconductor substrate 110. The device isolation region 124A includes a device isolation trench 124TA and a device isolation insulation layer 124IA in (e.g., partially or completely filling) the device isolation trench 124TA. In the pixel region APR, the buried insulation layer 126 may not be formed in the device isolation trench 124TA, but be formed on the entire second surface 110B of the semiconductor substrate 110.

In some embodiments, the device isolation insulation layer 124IA may include an insulating material (e.g., silicon oxide, silicon nitride, or silicon oxynitride). In some embodiments, an insulation liner may be conformally formed on an inner surface of the device isolation trench 124TA, and the device isolation insulation layer 124IA may be disposed on the insulation liner and fill the device isolation trench 124TA.

In some embodiments, the device isolation region 124A may include an insulation liner that is conformally formed on the inner surface of the device isolation trench 124TA and include a conductive buried layer which is on the insulation liner and fills the device isolation trench 124TA.

Figure 10:
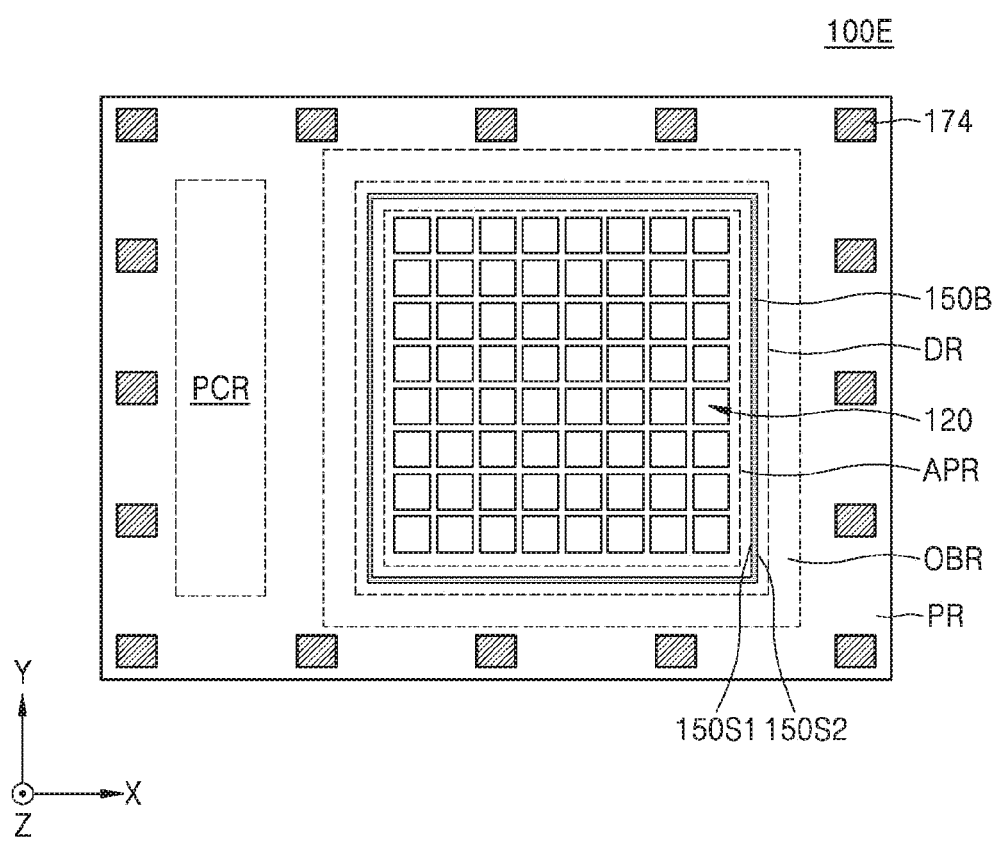
FIG. 10 is a layout diagram of an image sensor according to example embodiments.

FIG. 10 is a layout diagram of an image sensor according to example embodiments. In FIG. 10, the same reference numerals are used to denote the same elements as in FIGS. 1 to 9.

Referring to FIG. 10, in an image sensor 100E, the optical black region OBR entirely (e.g., continuously, on four sides) surrounds the pixel region APR. The dummy pixel region DR is disposed between the optical black region OBR and the pixel region APR and entirely surrounds the pixel region APR. For example, when the pixel region APR has a rectangular shape, the optical black region OBR may surround four sides of the pixel region APR with the dummy pixel region DR therebetween.

A first light shielding wall structure 150B is disposed in the dummy pixel region DR and defines a boundary of (e.g., surrounds) the pixel region APR. For example, the first light shielding wall structure 150B may face the four sides of the pixel region APR. A first side 150S1 of the first light shielding wall structure 150B faces the pixel region APR. A second side 150S2 of the first light shielding wall structure 150B is opposite to the first side 150S1 thereof and faces the optical black region OBR. Since the first light shielding wall structure 150B surrounding the pixel region APR penetrates the semiconductor substrate 110 (see FIG. 2), a portion of the semiconductor substrate 110 in the pixel region APR and another portion of the semiconductor substrate 110 in the optical black region OBR may be completely physically and electrically separated from each other. Thus, undesired stray light or electrons may be inhibited/prevented from penetrating from the pixel region APR to the optical black region OBR, such that a noise signal variation of the image sensor 100E may be reduced.

Figure 11:
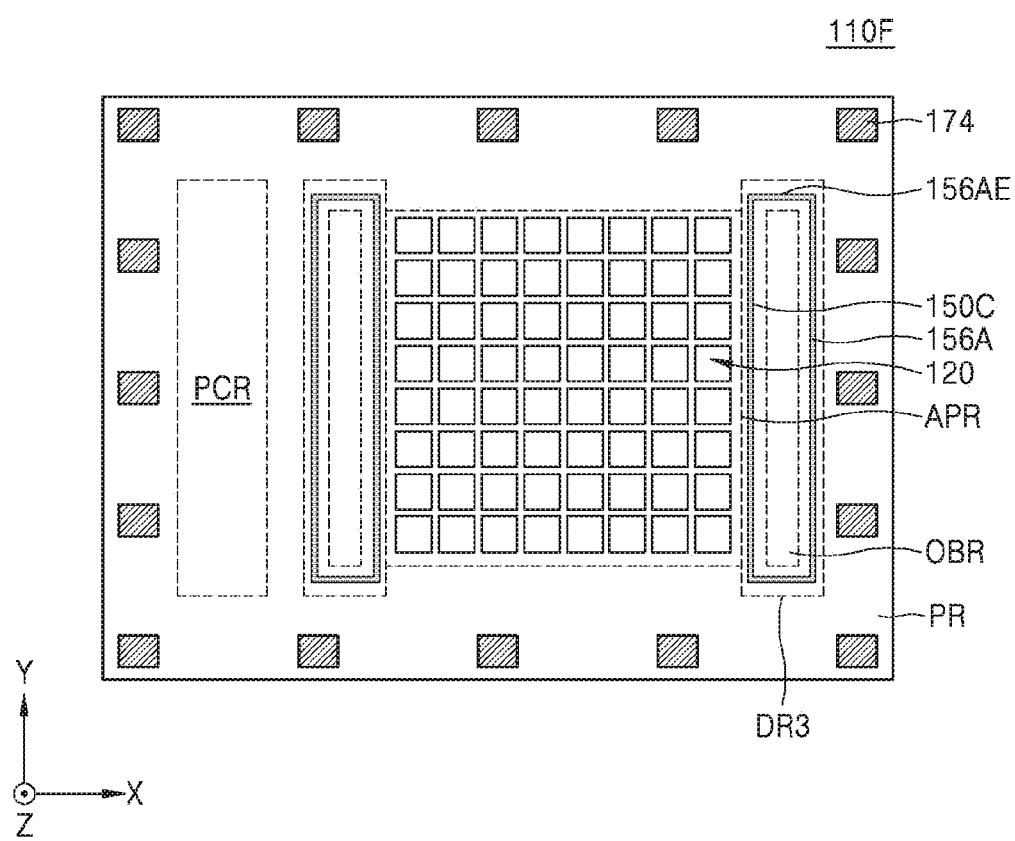
FIG. 11 is a layout diagram of an image sensor according to example embodiments.

FIG. 11 is a layout diagram of an image sensor according to example embodiments. In FIG. 11, the same reference numerals are used to denote the same elements as in FIGS. 1 to 10.

Referring to FIG. 11, in an image sensor 100F, a dummy pixel region DR3 surrounds the optical black region OBR. A first light shielding wall structure 150C and a second light shielding wall structure 156A are disposed in the in the dummy pixel region DR3 and are connected to each other. For example, the first light shielding wall structure 150C may extend in the second direction (Y direction) between the pixel region APR and the optical black region OBR. The second light shielding wall structure 156A may extend in the second direction (Y direction) between the optical black region OBR and the peripheral region PR. An extension portion 156AE of the second light shielding wall structure 156A may extend in the first direction (X direction) to be connected to an end portion of the first light shielding wall structure 150C.

Since the first light shielding wall structure 150C and the second light shielding wall structure 156A collectively completely surround the optical black region OBR, undesired stray light or electrons may be inhibited/prevented from penetrating from the pixel region APR to the optical black region OBR. Thus, a noise signal variation of the image sensor 100E may be reduced.

Figure 12:
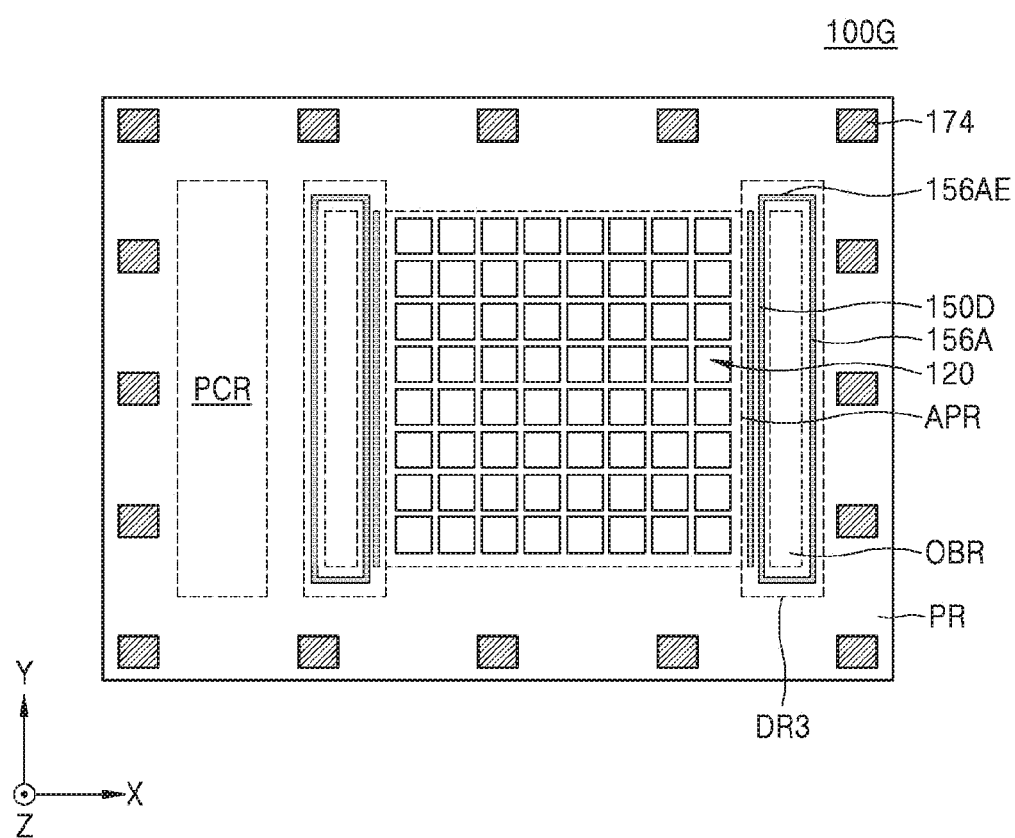
FIG. 12 is a layout diagram of an image sensor according to example embodiments.

FIG. 12 is a layout diagram of an image sensor according to example embodiments. In FIG. 12, the same reference numerals are used to denote the same elements as in FIGS. 1 to 11.

Referring to FIG. 12, in an image sensor 100G, a pair of first light shielding wall structures 150D and a second light shielding wall structure 156A are disposed in the dummy pixel region DR3. One of the pair of first light shielding wall structures 150D and the second light shielding wall structure 156A are connected to each other. For example, the pair of first light shielding wall structures 150D may extend in the second direction (Y direction) between the pixel region APR and the optical black region OBR. The second light shielding wall structure 156A may extend in the second direction (Y direction) between the optical black region OBR and the peripheral region PR. The extension portion 156AE of the second light shielding wall structure 156A may extend in the first direction (X direction) to be connected to an end portion of one of the pair of first light shielding wall structures 150D.

Since the pair of first light shielding wall structures 150D and the second light shielding wall structure 156A collectively completely surround the optical black region OBR, undesired stray light or electrons may be inhibited/prevented from penetrating from the pixel region APR and the peripheral region PR to the optical black region OBR. Thus, a noise signal variation of the image sensor 100G may be reduced.

Figure 13:
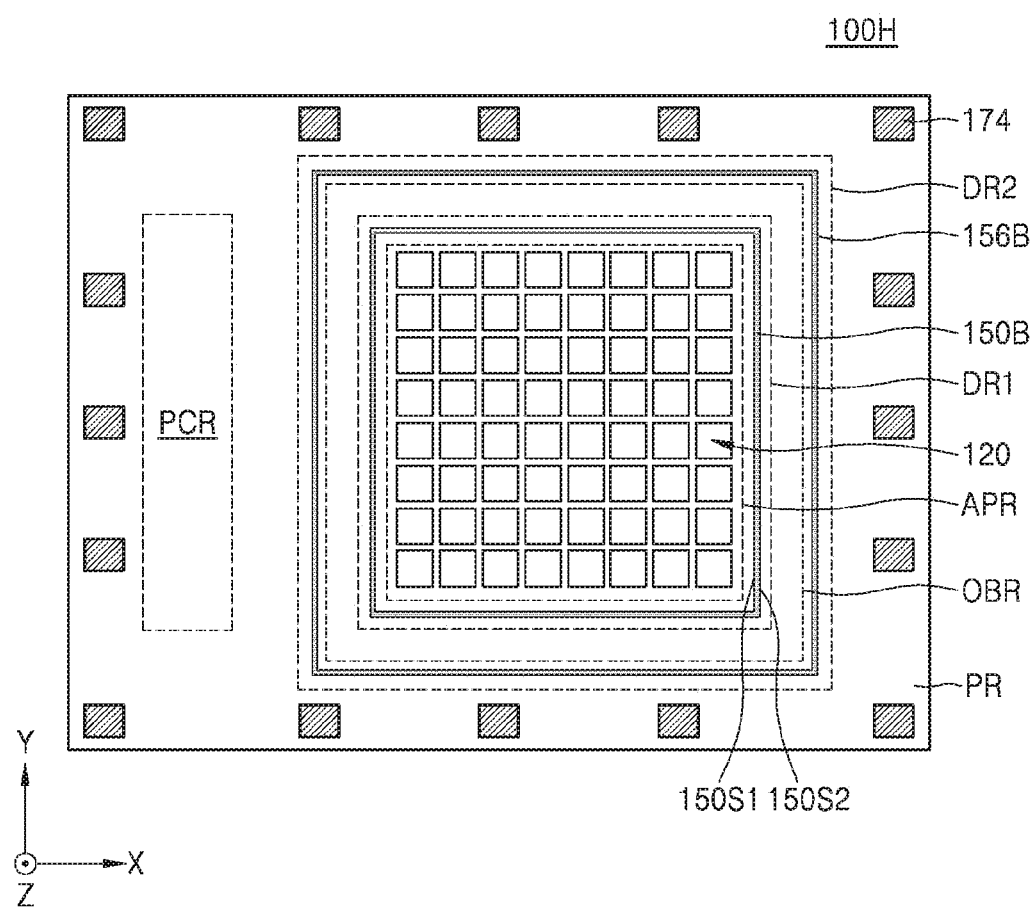
FIG. 13 is a layout diagram of an image sensor according to example embodiments.

FIG. 13 is a layout diagram of an image sensor according to example embodiments. In FIG. 13, the same reference numerals are used to denote the same elements as in FIGS. 1 to 12.

Referring to FIG. 13, in an image sensor 100H, the optical black region OBR surrounds four sides of the pixel region APR. The dummy pixel region DR1 is disposed between the optical black region OBR and the pixel region APR. The guard ring region DR2 is disposed between the optical black region OBR and the peripheral region PR and surrounds four sides of the optical black region OBR. The first light shielding wall structure 150B is disposed in the dummy pixel region DR1. A second light shielding wall structure 156B is disposed in the guard ring region DR2.

Figure 14:
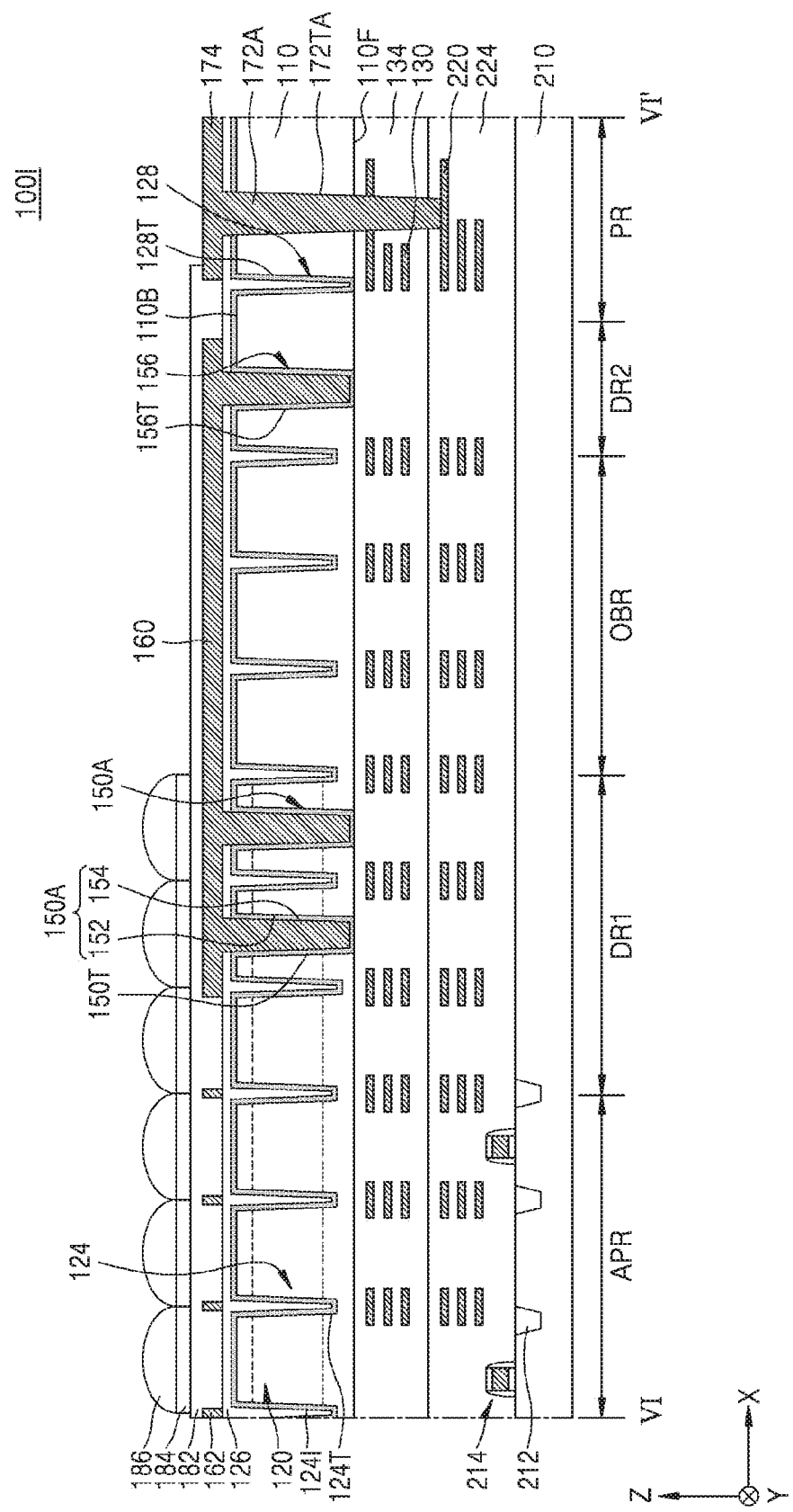
FIG. 14 is a cross-sectional view of an image sensor according to example embodiments.

FIG. 14 is a cross-sectional view of an image sensor according to example embodiments. FIG. 14 is a cross-sectional view taken along line VI-VI' of FIG. 5. In FIG. 14, the same reference numerals are used to denote the same elements as in FIGS. 1 to 13.

Referring to FIG. 14, an image sensor 100I has a stack structure in which the semiconductor substrate 110 and a lower substrate 210 are bonded to each other.

An active region defined by a device isolation layer 212 may be formed in the lower substrate 210. A gate structure 214 is disposed on the lower substrate 210. The gate structure 214 may constitute each of a plurality of CMOS transistors that provides a certain signal to each photoelectric conversion region 120 of the pixel region APR and controls an output signal from each photoelectric conversion region 120. For example, the transistors may constitute various kinds of logic circuits (e.g., a timing generator, a row decoder, a column driver, a correlated double sampler (CDS), an analog to digital converter (ADC), a latch, a column decoder), but are not limited thereto.

A second inner wiring structure 220 is disposed on the lower substrate 210. The second inner wiring structure 220 may be formed of a multi-layered stack structure. A second interlayer insulation layer 224 is disposed on the lower substrate 210 to cover the gate structure 214 and the second inner wiring structure 220.

The first interlayer insulation layer 134 may be bonded to the second interlayer insulation layer 224. In some embodiments, the first and second interlayer insulation layers 134 and 224 may be bonded to each other by an oxide-oxide direct bonding method. In some embodiments, an adhesive may be interposed between the first interlayer insulation layer 134 and the second interlayer insulation layer 224.

A through via trench 172TA penetrates the semiconductor substrate 110 and the first interlayer insulation layer 134 and is connected to a portion of the second inner wiring structure 220. A through via 172A is connected to both of the first inner wiring structure 130 and the second inner wiring structure 220. A bottom portion of the through via 172A may be surrounded by the second interlayer insulation layer 224.

FIGS. 15 to 21 are cross-sectional views of a method of manufacturing an image sensor according to example embodiments. FIGS. 15 to 21 are cross-sectional views taken along line VI-VI' of FIG. 5. In FIGS. 15 to 21, the same reference numerals are used to denote the same elements as in FIGS. 1 to 14.

Figure 15:
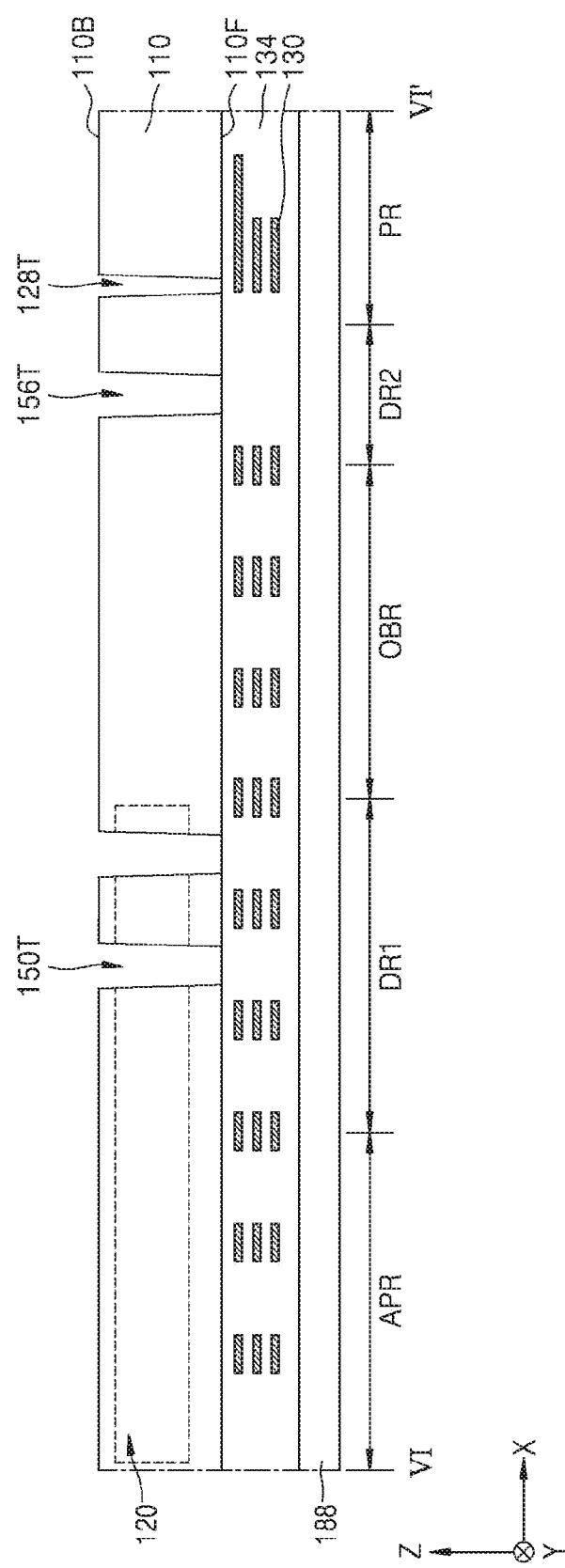
FIGS. 15 to 21 are cross-sectional views illustrating a method of manufacturing an image sensor according to example embodiments.

Referring to FIG. 15, the semiconductor substrate 110 having the first surface 110F and the second surface 110B that are opposite to each other are provided/prepared.

The photoelectric conversion region 120 and a well region may be formed in the semiconductor substrate 110 by performing an ion implantation process on the first surface 110F of the semiconductor substrate 110. For example, the photoelectric conversion region 120 may be formed by doping an n-type impurity, and the well region may be formed by doping a p-type impurity.

The first inner wiring structure 130 and the first interlayer insulation layer 134 covering the first inner wiring structure 130 may be formed on the first surface 110F of the semiconductor substrate 110. For example, the first inner wiring structure 130 and the first interlayer insulation layer 134 may be formed by repeatedly performing process steps in which a conductive layer is formed on the first surface 110F of the semiconductor substrate 110, the conductive layer is patterned, and an insulating layer is formed to cover the patterned conductive layer.

A supporting substrate 188 is bonded to the first surface 110F of the semiconductor substrate 110.

A first mask pattern may be formed on the second surface 110B of the semiconductor substrate 110. The semiconductor substrate 110 may be etched from the second surface 110B thereof using the first mask pattern as an etch mask, thus forming the first light shielding trench 150T, the second light shielding trench 156T, and the pad isolation trench 128T.

The first light shielding trench 150T, the second light shielding trench 156T, and the pad isolation trench 128T may completely penetrate the semiconductor substrate 110. Thus, an upper surface of the first interlayer insulation layer 134 may be exposed on/as lower surfaces of the first light shielding trench 150T, the second light shielding trench 156T, and the pad isolation trench 128T.

Figure 16:
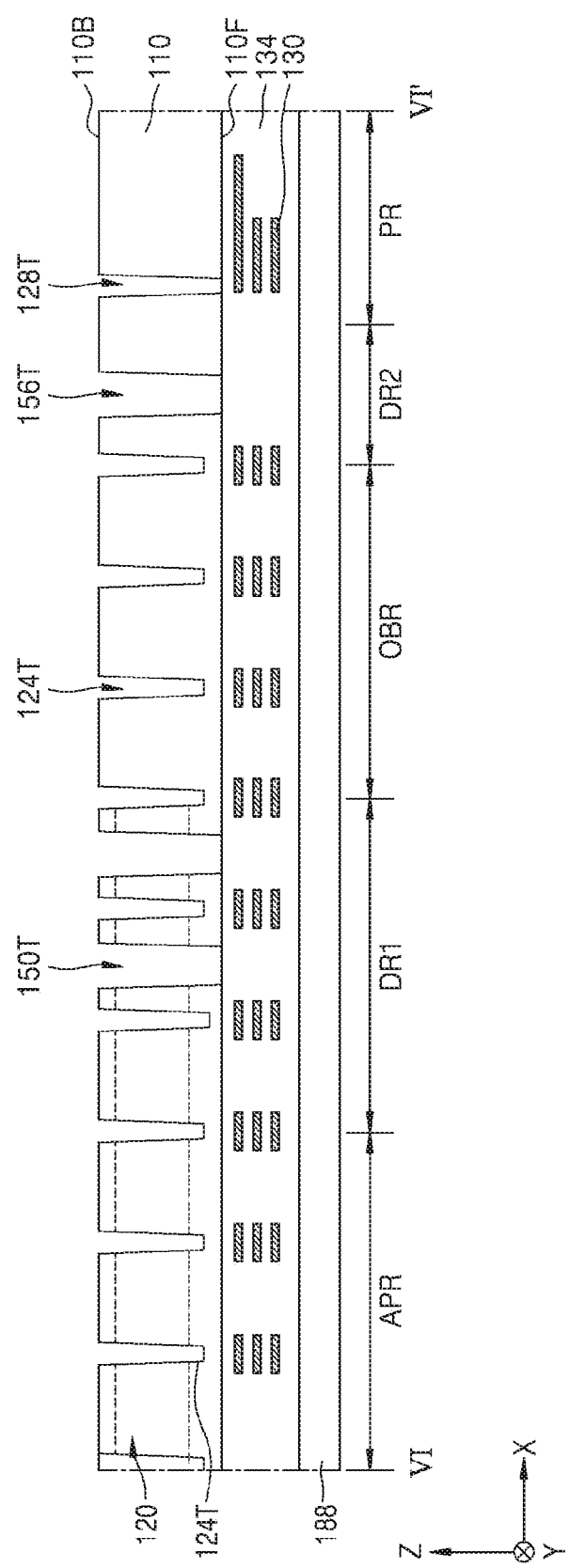

Referring to FIG. 16, a second mask pattern may be formed on the second surface 110B of the semiconductor substrate 110. The semiconductor substrate 110 may be etched from the second surface 110B thereof using the second mask pattern as an etch mask, thus forming the device isolation trench 124T.

In some embodiments, the device isolation trench 124T may be formed to partly penetrate the semiconductor substrate 110 to expose a portion of the semiconductor substrate 110 at/as a lower surface thereof.

In some embodiments, the device isolation trench 124T may be formed to partly penetrate the semiconductor substrate 110, and an ion implantation process may be performed on a portion of the semiconductor substrate 110 exposed on/as a lower surface of the device isolation trench 124T to form an additional impurity region below the device isolation trench 124T.

Figure 17:
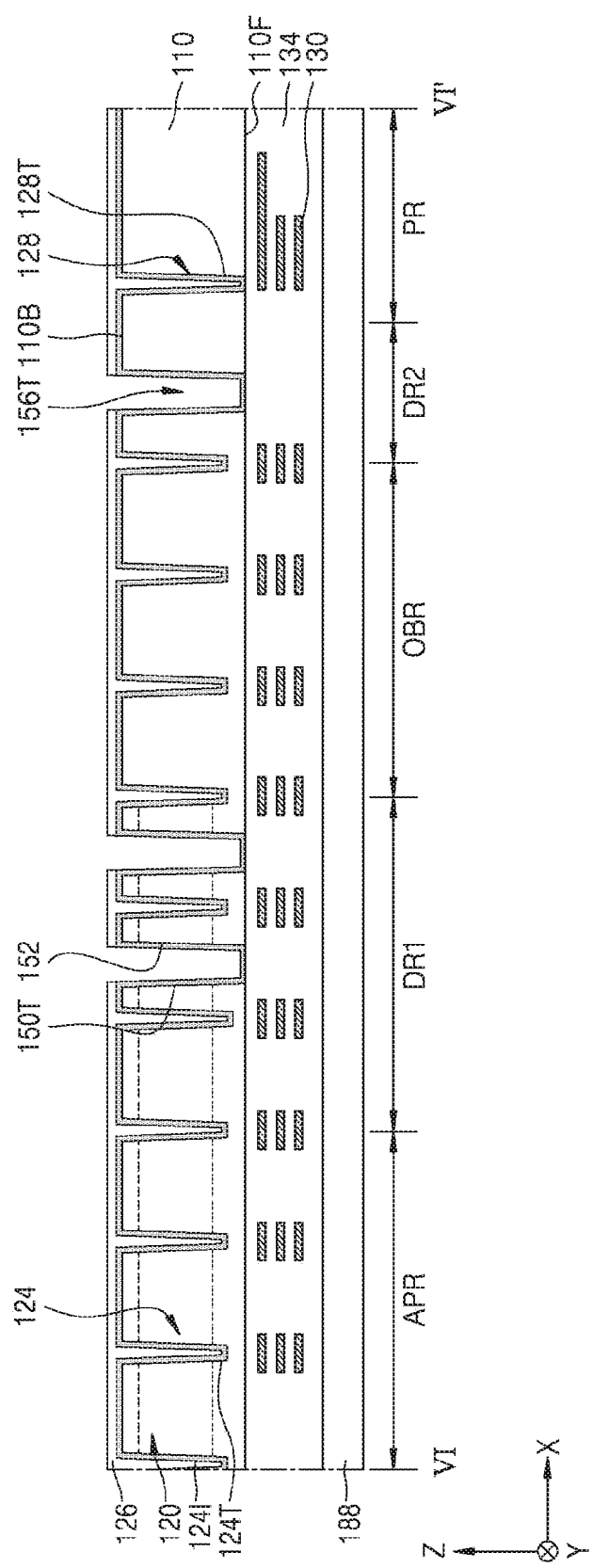

Referring to FIG. 17, an insulation material may be deposited on the second surface 110B of the semiconductor substrate 110 and inner surfaces of the device isolation trench 124T, the pad isolation trench 128T, the first light shielding trench 150T, and the second light shielding trench 156T, by a chemical vapor deposition (CVD) process or an atomic layer deposition (ALD) process, thus forming the backside insulation layer 124I on the second surface 110B of the semiconductor substrate 110 and inner surfaces of the device isolation trench 124T and the pad isolation trench 128T, and forming the light shielding insulation layer 152 on the inner surfaces of the first light shielding trench 150T and the second light shielding trench 156T. Accordingly, the backside insulation layer 124I and the light shielding insulation layer 152 may be the same insulation layer/material.

An insulation layer may be formed on the second surface 110B of the semiconductor substrate 110 to fill the device isolation trench 124T, the pad isolation trench 128T, the first light shielding trench 150T, and the second light shielding trench 156T, thus forming the buried insulation layer 126 that fills the device isolation trench 124T, the pad isolation trench 128T, the first light shielding trench 150T, and the second light shielding trench 156T. The buried insulation layer 126 may be formed on the second surface 110B of the semiconductor substrate 110 with a predetermined thickness.

In some embodiments, an etch back process may be performed on the inner surfaces of the first light shielding trench 150T and the second light shielding trench 156T, thus removing the portions of the buried insulation layer 126 that fill the first light shielding trench 150T and the second light shielding trench 156T.

In some embodiments, the backside insulation layer 124I may be formed with a sufficient thickness to completely fill the device isolation trench 124T and the pad isolation trench 128T. The buried insulation layer 126 may be formed on the second surface 110B of the semiconductor substrate 110 using a low or poor step coverage material. In this case, since the buried insulation layer 126 is mainly formed on the second surface 110B of the semiconductor substrate 110 and does not fill the first and second light shielding trenches 150T and 156T, the aforementioned etch back process may be omitted.

Figure 18:
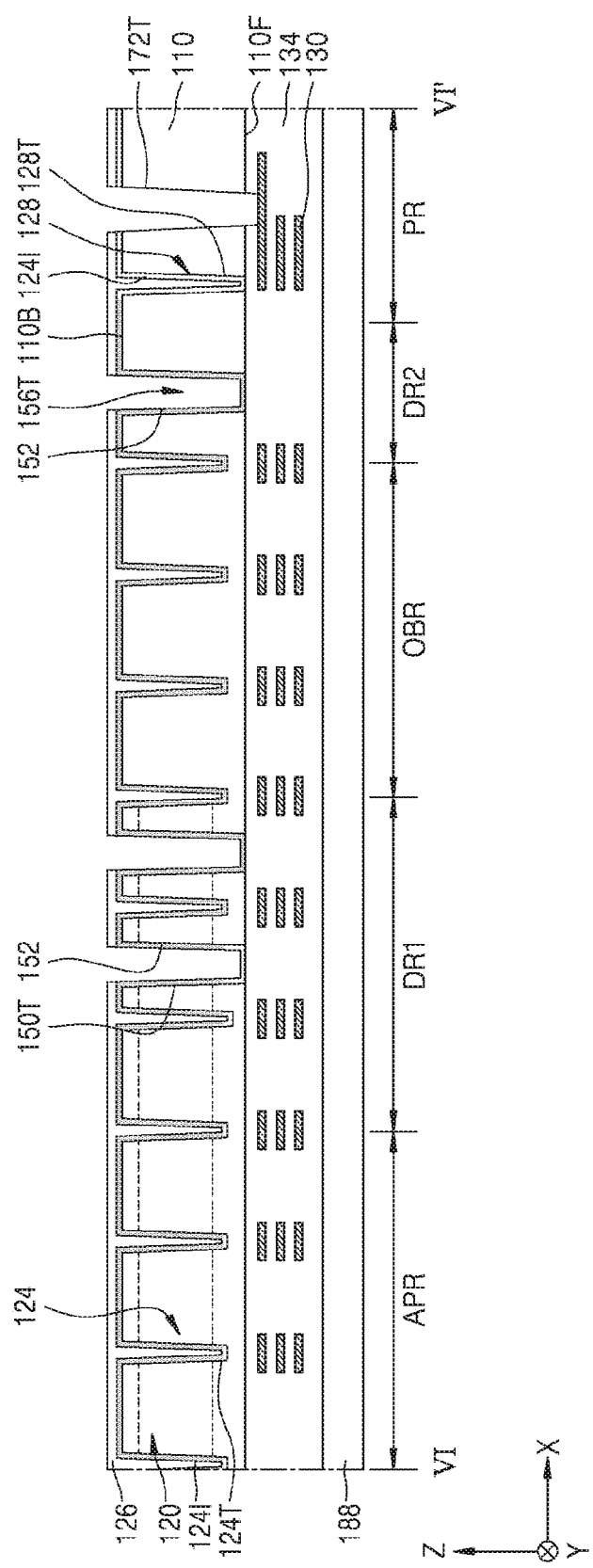

Referring to FIG. 18, a third mask pattern may be formed on the buried insulation layer 126. The buried insulation layer 126, the backside insulation layer 124I, the semiconductor substrate 110, and the first interlayer insulation layer 134 are etched using the third mask pattern as an etch mask to form the through via trench 172T. The first inner wiring structure 130 may be exposed on/as a lower surface of the through via trench 172T.

Figure 19:
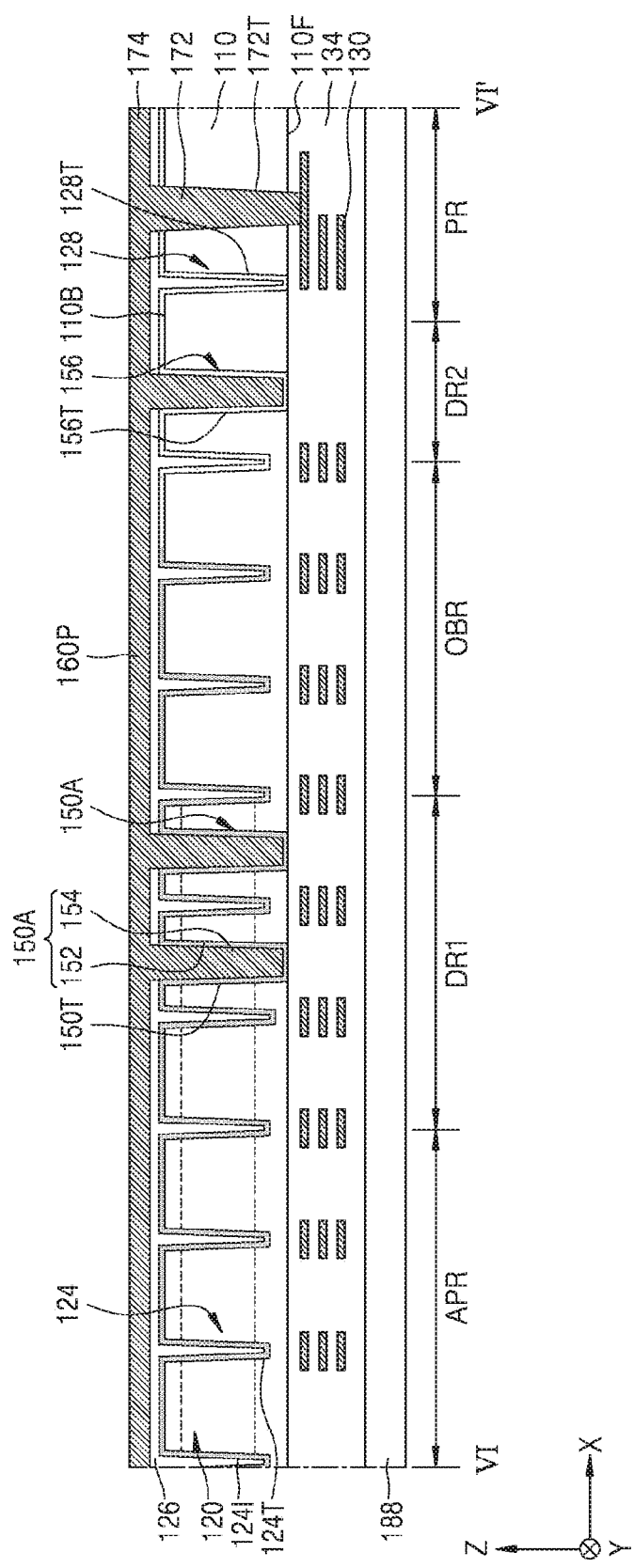

Referring to FIG. 19, a metal layer 160P is formed to fill the first light shielding trench 150T, the second light shielding trench 156T, and the through via trench 172T. The metal layer 160P may be formed by sequentially forming a first metal layer and a second metal layer. The first metal layer may be conformally formed on the inner surface of the first light shielding trench 150T, the inner surface of the second light shielding trench 156T, and an inner surface of the through via trench 172T. The second metal layer may be formed on the first metal layer to completely fill the first light shielding trench 150T, the second light shielding trench 156T, and the through via trench 172T.

For example, the first metal layer may be formed using metal (e.g., titanium, titanium nitride, tantalum, tantalum nitride, titanium tungsten, tungsten, aluminum, cobalt, nickel, or copper) by a CVD process or an ALD process. The second metal layer may be formed using metal (e.g., tungsten, aluminum, cobalt, nickel, or copper) by a CVD process, an ALD process, or a plating process.

As the first light shielding trench 150T, the second light shielding trench 156T, and the through via trench 172T are completely filled with the metal layer 160P, the first light shielding wall structure 150A, the second light shielding wall structure 156, and the through via 172 are formed in the first light shielding trench 150T, the second light shielding trench 156T, and the through via trench 172T, respectively.

Figure 20:
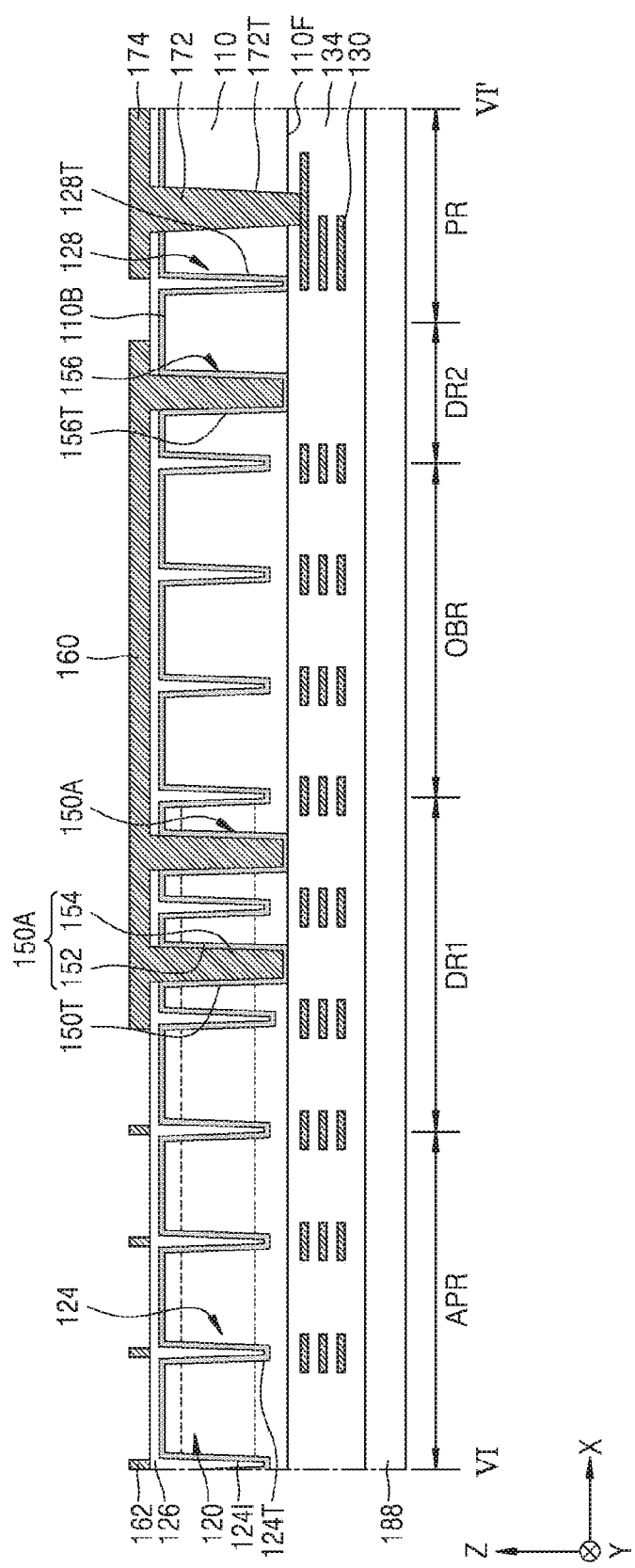

Referring to FIG. 20, a fourth mask pattern may be formed on the metal layer 160P. The metal layer 160P is patterned using the fourth mask pattern as an etch mask to form the light shielding layer 160, the guide pattern 162, and the conductive pad 174.

Figure 21:
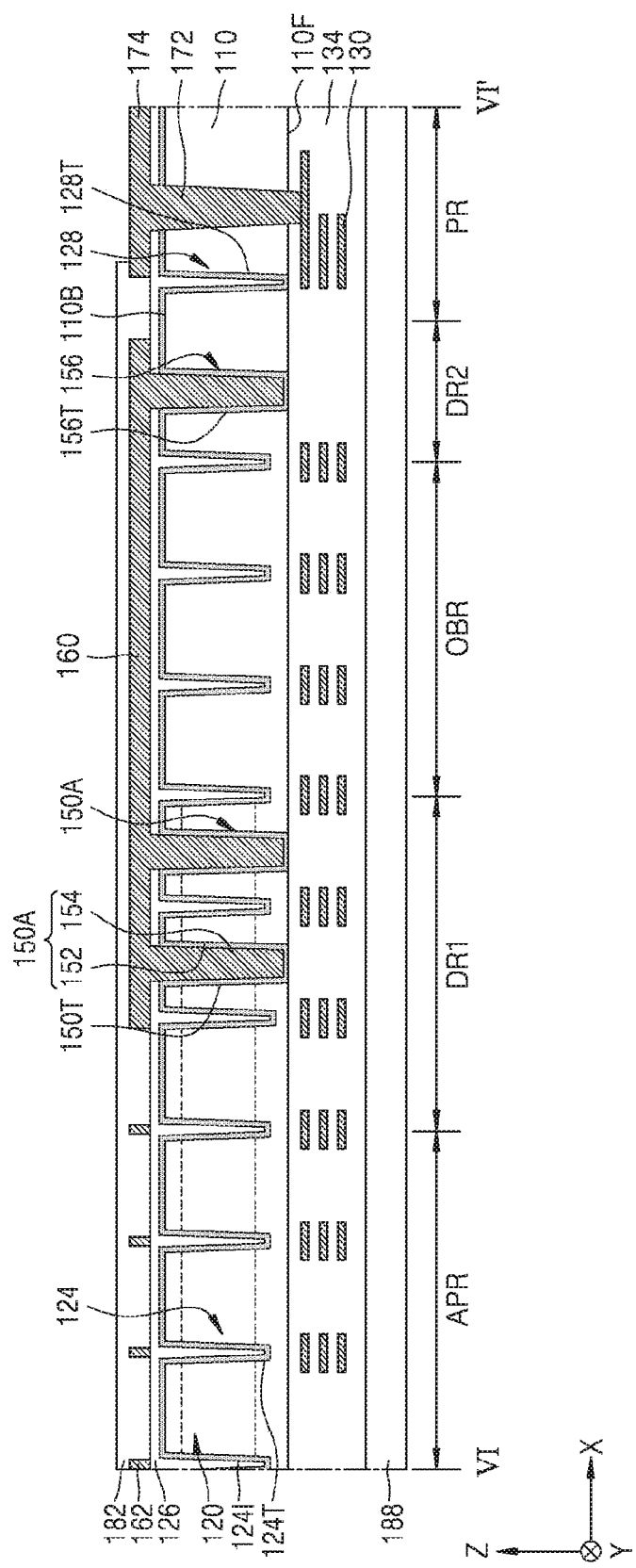

Referring to FIG. 21, the passivation layer 182 is formed on the second surface 110B of the semiconductor substrate 110 on (e.g., to partially or completely cover) the light shielding layer 160, the guide pattern 162, and the conductive pad 174. The passivation layer 182 is patterned to expose an upper surface of the conductive pad 174.

Thereafter, referring again to FIG. 6, the color filter 184 and the micro-lens 186 are formed on the passivation layer 182 in the pixel region APR and the dummy pixel region DR1. Thus, the image sensor 100A may be achieved.

Although the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. An image sensor comprising:
   a semiconductor substrate comprising a pixel region and an optical black region;
   a plurality of photoelectric conversion regions in the pixel region;
   a wiring structure on a first surface of the semiconductor substrate;
   a light shielding layer on a second surface of the semiconductor substrate in the optical black region; and
   a first light shielding wall structure penetrating the semiconductor substrate between the pixel region and the optical black region, the first light shielding wall structure connected to the light shielding layer.

2. The image sensor according to claim 1, wherein the first light shielding wall structure comprises:
   an insulation layer in a trench that extends in the semiconductor substrate from the first surface of the semiconductor substrate to the second surface of the semiconductor substrate; and
   a metal layer on the insulation layer in the trench.

3. The image sensor according to claim 2, wherein the metal layer comprises a same material as the light shielding layer.

4. The image sensor according to claim 2, wherein the insulation layer comprises a portion that is outside of the trench and extends between the light shielding layer and the second surface of the semiconductor substrate.

5. The image sensor according to claim 2,
   wherein the metal layer and the light shielding layer comprise a continuous layer that extends from the trench onto the second surface of the semiconductor substrate,
   wherein the trench comprises a first width at a level that is coplanar with the second surface of the semiconductor substrate and a second width at a level that is coplanar with the first surface of the semiconductor substrate, and
   wherein the first width is greater than the second width.

6. The image sensor according to claim 1, wherein the first light shielding wall structure continuously extends from the first surface of the semiconductor substrate to the second surface of the semiconductor substrate.

7. The image sensor according to claim 1,
   wherein the semiconductor substrate further comprises a dummy pixel region between the pixel region and the optical black region,
   wherein the light shielding layer extends onto the dummy pixel region,
   wherein the first light shielding wall structure is between first and second photodiode regions that are in the dummy pixel region; and
   wherein the first light shielding wall structure is vertically overlapped by the light shielding layer.

8. The image sensor according to claim 7,
   wherein a first side of the first light shielding wall structure faces the pixel region, and
   wherein a second side of the first light shielding wall structure that is opposite to the first side of the first light shielding wall structure faces the optical black region.

9. The image sensor according to claim 7,
   wherein the optical black region extends in a direction that is parallel to the first surface of the semiconductor substrate and that is parallel to the pixel region,
   wherein the dummy pixel region extends in the direction, between the optical black region and the pixel region, and
   wherein the first light shielding wall structure extends in the direction an entire length that the dummy pixel region extends in the direction.

10. The image sensor according to claim 7, wherein the optical black region and the first light shielding wall structure define a boundary of the pixel region.

11. The image sensor according to claim 7,
    wherein the semiconductor substrate further comprises a peripheral region on at least one side of the optical black region,
    wherein the image sensor further comprises a second light shielding wall structure between the optical black region and the peripheral region, and
    wherein the second light shielding wall structure penetrates the semiconductor substrate and is connected to the light shielding layer.

12. The image sensor according to claim 11, further comprising:
    a conductive pad on the second surface of the semiconductor substrate in the peripheral region;
    a through via penetrating the semiconductor substrate in the peripheral region, the through via electrically connected to the conductive pad and the wiring structure; and
    a third light shielding wall structure penetrating the semiconductor substrate in the dummy pixel region, the third light shielding wall structure comprising an upper surface that contacts the light shielding layer and a lower surface that is coplanar with a lower surface of the through via.

13. An image sensor comprising:
    a semiconductor substrate comprising a pixel region, an optical black region, and a dummy pixel region between the pixel region and the optical black region;
    a plurality of photoelectric conversion regions in the pixel region;
    a wiring structure on a first surface of the semiconductor substrate;
    a light shielding layer on a second surface of the semiconductor substrate in the optical black region; and
    at least one first light shielding wall structure in the dummy pixel region, the at least one first light shielding wall structure penetrating the semiconductor substrate and connected to the light shielding layer.

14. The image sensor according to claim 13, wherein the at least one first light shielding wall structure comprises:

an insulation layer in a trench between first and second photodiode regions that are in the dummy pixel region of the semiconductor substrate; and a metal layer on the insulation layer in the trench and integrally connected to the light shielding layer.

15. The image sensor according to claim 13, wherein the semiconductor substrate further comprises a peripheral region beside the optical black region, wherein the image sensor further comprises a second light shielding wall structure between the optical black region and the peripheral region, wherein the optical black region and the peripheral region are free of the plurality of photoelectric conversion regions, wherein the second light shielding wall structure penetrates the semiconductor substrate and is connected to the light shielding layer, and wherein the at least one first light shielding wall structure and the second light shielding wall structure extend from the first surface of the semiconductor substrate to the second surface of the semiconductor substrate.

16. An image sensor comprising:

a semiconductor substrate comprising a pixel region, an optical black region, and a dummy pixel region between the pixel region and the optical black region;

a plurality of photoelectric conversion regions in the pixel region;

a wiring structure on a first surface of the semiconductor substrate;

a conductive through via that is electrically connected to the wiring structure;

a light shielding layer on a second surface of the semiconductor substrate in at least a portion of each of the optical black region and the dummy pixel region; and a light shielding wall structure in the semiconductor substrate in the dummy pixel region, wherein the light shielding layer vertically overlaps the light shielding wall structure.

17. The image sensor according to claim 16, wherein the light shielding wall structure comprises:

an insulation layer in a trench that extends in the semiconductor substrate from the first surface of the semiconductor substrate to the second surface of the semiconductor substrate; and a metal layer on the insulation layer in the trench and comprising a same metal as the light shielding layer.

18. The image sensor according to claim 16, wherein the light shielding wall structure comprises a first width at a level coplanar with the second surface of the semiconductor substrate and a second width at a level coplanar with the first surface of the semiconductor substrate, and wherein the first width is greater than the second width.

19. The image sensor according to claim 16, further comprising a metal guide pattern on the second surface of the semiconductor substrate in the pixel region, wherein opposing first and second sidewalls of the light shielding wall structure extend continuously from the second surface of the semiconductor substrate to the first surface of the semiconductor substrate between the pixel region and the optical black region.

20. The image sensor according to claim 16, wherein the light shielding wall structure is electrically isolated from the wiring structure, and wherein the light shielding layer does not vertically overlap the conductive through via.

* * * * *